United States Patent
Yamazaki

(10) Patent No.: US 8,319,219 B2
(45) Date of Patent: Nov. 27, 2012

(54) LIGHT-EMITTING DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 2345 days.

(21) Appl. No.: 10/885,651

(22) Filed: Jul. 8, 2004

(65) Prior Publication Data

US 2005/0012097 A1    Jan. 20, 2005

(30) Foreign Application Priority Data

Jul. 14, 2003 (JP) ................................. 2003-273872

(51) Int. Cl.
    *H01L 29/04* (2006.01)
(52) U.S. Cl. ............. 257/59; 257/E29.288; 257/E29.293
(58) Field of Classification Search .................... 257/59, 257/E21.414, E29.288, E29.289, E29.291
    See application file for complete search history.

(56) References Cited

U.S. PATENT DOCUMENTS

| | | | |
|---|---|---|---|
| 4,409,134 A | 10/1983 | Yamazaki | |
| 4,464,415 A | 8/1984 | Yamazaki | |
| 4,581,620 A | 4/1986 | Yamazaki et al. | |
| 5,003,356 A | 3/1991 | Wakai et al. | |
| 5,091,334 A | 2/1992 | Yamazaki et al. | |
| 5,262,350 A | 11/1993 | Yamazaki et al. | |
| 5,262,654 A | 11/1993 | Yamazaki | |
| RE34,658 E | 7/1994 | Yamazaki et al. | |
| 5,453,858 A | 9/1995 | Yamazaki | |
| 5,514,879 A | 5/1996 | Yamazaki | |
| 5,591,987 A | 1/1997 | Yamazaki et al. | |
| 5,614,732 A | 3/1997 | Yamazaki | |
| 5,701,167 A | 12/1997 | Yamazaki | |
| 5,821,563 A | 10/1998 | Yamazaki et al. | |
| 5,849,601 A | 12/1998 | Yamazaki | |
| 5,859,443 A | 1/1999 | Yamazaki et al. | |

(Continued)

FOREIGN PATENT DOCUMENTS

CN    1260592 A    7/2000

(Continued)

OTHER PUBLICATIONS

Office Action (Application No. 200910009687.4) Dated Mar. 31, 2010.

(Continued)

*Primary Examiner* — Colleen Matthews
(74) *Attorney, Agent, or Firm* — Eric J. Robinson; Robinson Intellectual Property Law Office, P.C.

(57) ABSTRACT

According to present invention, system on panel without complicating the process of TFT can be realized, and a light-emitting device that can be formed by lower cost than that of the conventional light-emitting device can be provided. A light-emitting device is provided in which a pixel portion is provided with a pixel including a light-emitting element and a TFT for controlling supply of current to the light-emitting element; a TFT included in a drive circuit and a TFT for controlling supply of current to the light-emitting element include a gate electrode, a gate insulating film formed over the gate electrode, a first semiconductor film, which overlaps with the gate electrode via the gate insulating film, a pair of second semiconductor films formed over the first semiconductor film; the pair of second semiconductor films are doped with an impurity to have one conductivity type; and the first semiconductor film is formed by semiamorphous semiconductor.

18 Claims, 16 Drawing Sheets

U.S. PATENT DOCUMENTS

| | | | |
|---|---|---|---|
| 5,859,445 A | 1/1999 | Yamazaki | |
| 6,011,277 A | 1/2000 | Yamazaki | |
| 6,013,928 A | 1/2000 | Yamazaki et al. | |
| 6,023,075 A | 2/2000 | Yamazaki | |
| 6,028,333 A | 2/2000 | Yamazaki et al. | |
| 6,030,265 A | 2/2000 | Inada | |
| 6,107,640 A * | 8/2000 | Park et al. | 257/59 |
| 6,121,660 A | 9/2000 | Yamazaki et al. | |
| 6,153,893 A | 11/2000 | Inoue et al. | |
| 6,177,302 B1 | 1/2001 | Yamazaki et al. | |
| 6,252,249 B1 | 6/2001 | Yamazaki | |
| 6,255,705 B1 | 7/2001 | Zhang et al. | |
| 6,261,877 B1 | 7/2001 | Yamazaki et al. | |
| 6,278,131 B1 | 8/2001 | Yamazaki et al. | |
| 6,281,520 B1 | 8/2001 | Yamazaki | |
| 6,306,213 B1 | 10/2001 | Yamazaki | |
| 6,342,936 B1 | 1/2002 | Murayama et al. | |
| 6,355,941 B1 | 3/2002 | Yamazaki et al. | |
| 6,437,367 B1 * | 8/2002 | Yamazaki et al. | 257/59 |
| 6,468,839 B2 | 10/2002 | Inoue et al. | |
| 6,566,175 B2 | 5/2003 | Yamazaki et al. | |
| 6,606,045 B2 | 8/2003 | Azami et al. | |
| 6,680,223 B1 | 1/2004 | Yamazaki et al. | |
| 6,707,107 B2 | 3/2004 | Kido | |
| 6,737,676 B2 | 5/2004 | Yamazaki | |
| 6,791,145 B2 | 9/2004 | Kido | |
| 6,900,463 B1 | 5/2005 | Yamazaki et al. | |
| 6,906,347 B2 | 6/2005 | Yamazaki et al. | |
| 6,924,528 B2 | 8/2005 | Yamazaki et al. | |
| 6,949,766 B2 | 9/2005 | Kido | |
| 6,953,976 B2 | 10/2005 | Kido | |
| 6,977,422 B2 | 12/2005 | Kido | |
| 7,030,467 B2 | 4/2006 | Kido | |
| 7,060,623 B2 | 6/2006 | Kido | |
| 7,067,844 B2 | 6/2006 | Yamazaki | |
| 7,098,479 B1 | 8/2006 | Yamazaki | |
| 7,115,902 B1 | 10/2006 | Yamazaki | |
| RE39,393 E | 11/2006 | Yamazaki | |
| 7,473,968 B2 | 1/2009 | Yamazaki et al. | |
| 7,554,164 B2 | 6/2009 | Kido | |
| 7,576,360 B2 | 8/2009 | Yamazaki | |
| 2002/0041355 A1 * | 4/2002 | Yamazaki et al. | 349/149 |
| 2002/0163457 A1 * | 11/2002 | Azami et al. | 341/150 |
| 2003/0057435 A1 * | 3/2003 | Walker | 257/135 |
| 2003/0170939 A1 | 9/2003 | Yamazaki et al. | |
| 2006/0115924 A1 | 6/2006 | Kido | |
| 2007/0018165 A1 | 1/2007 | Yamazaki | |
| 2007/0146568 A1 | 6/2007 | Yamazaki et al. | |

FOREIGN PATENT DOCUMENTS

| | | |
|---|---|---|
| CN | 1355561 A | 6/2002 |
| CN | 1388574 A | 1/2003 |
| EP | 0535979 A | 4/1993 |
| EP | 0592227 A | 4/1994 |
| EP | 0 652 595 | 5/1995 |
| EP | 1020920 A | 7/2000 |
| JP | 56-122123 | 9/1981 |
| JP | 57-013777 | 1/1982 |
| JP | 61-104671 | 5/1986 |
| JP | 03-222370 | 10/1991 |
| JP | 03-233431 | 10/1991 |
| JP | 0 485 233 | 5/1992 |
| JP | 04-177736 | 6/1992 |
| JP | 04-206969 | 7/1992 |
| JP | 04-242725 | 8/1992 |
| JP | 05-129608 A | 5/1993 |
| JP | 07-131030 | 5/1995 |
| JP | 10-189977 A | 7/1998 |
| JP | 10-256554 | 9/1998 |
| JP | 11-097705 | 4/1999 |
| JP | 11-097706 | 4/1999 |
| JP | 2001-068684 A | 3/2001 |
| JP | 2001-264807 | 9/2001 |
| KR | 1993-0013808 A | 7/1993 |
| KR | 1998-0010575 | 4/1998 |
| KR | 1998-0023376 | 7/1998 |
| KR | 1999-0007410 A | 1/1999 |
| KR | 1999-0046858 | 7/1999 |
| KR | 2002-0001619 A | 1/2002 |

OTHER PUBLICATIONS

S. Kasouit et al., "Microcrystalline silicon: An emerging material for AMLCD," AMLCD'03, pp. 111-114.

Office Action (Application No. 2007-0106455) Dated Sep. 28, 2009.

Office Action (Application No. 200810144501.1) Dated Sep. 11, 2009.

Korean Office Action (Application No. 2009-0061067) Dated Feb. 22, 2011.

Korean Office Action (Application No. 2004-0054276) Dated Jan. 6, 2011.

Taiwanese Office Action (Application No. 093120486) Dated Aug. 31, 2011.

Korean Office Action (Application No. 2011-0136434) Dated Feb. 24, 2012.

* cited by examiner

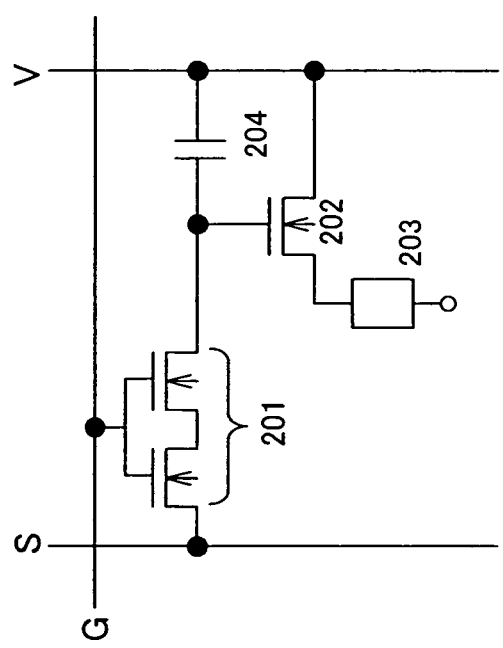
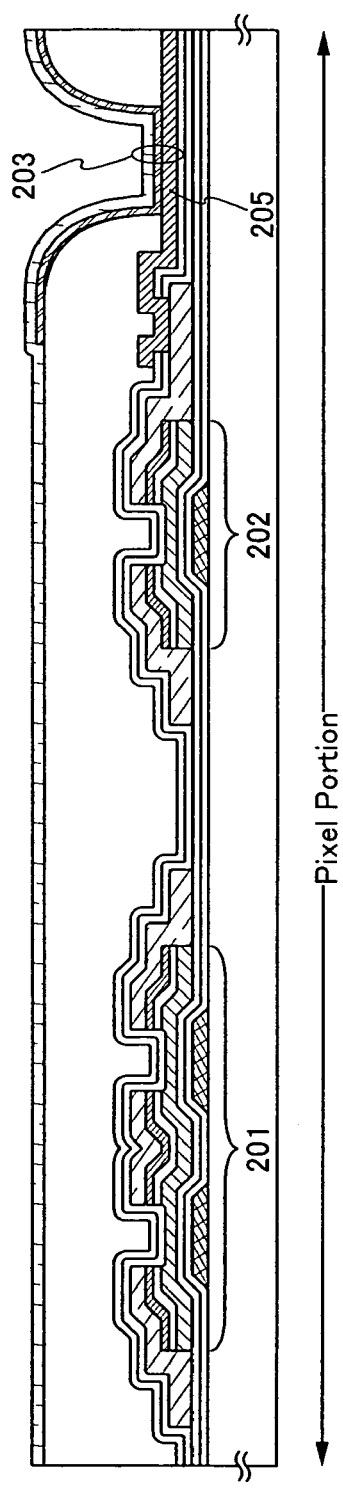
Fig. 2A
Fig. 2B

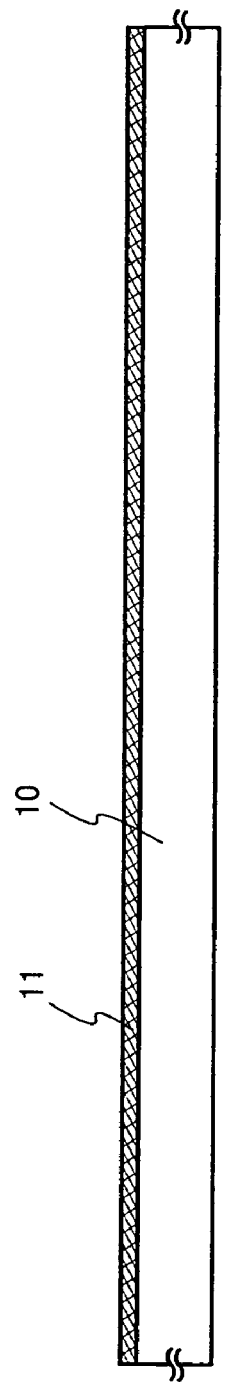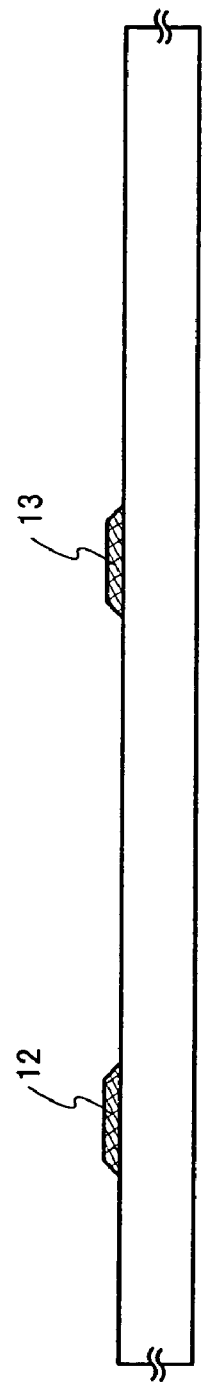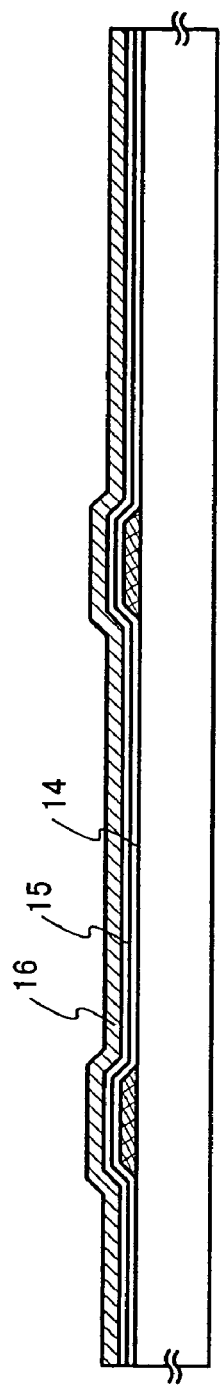

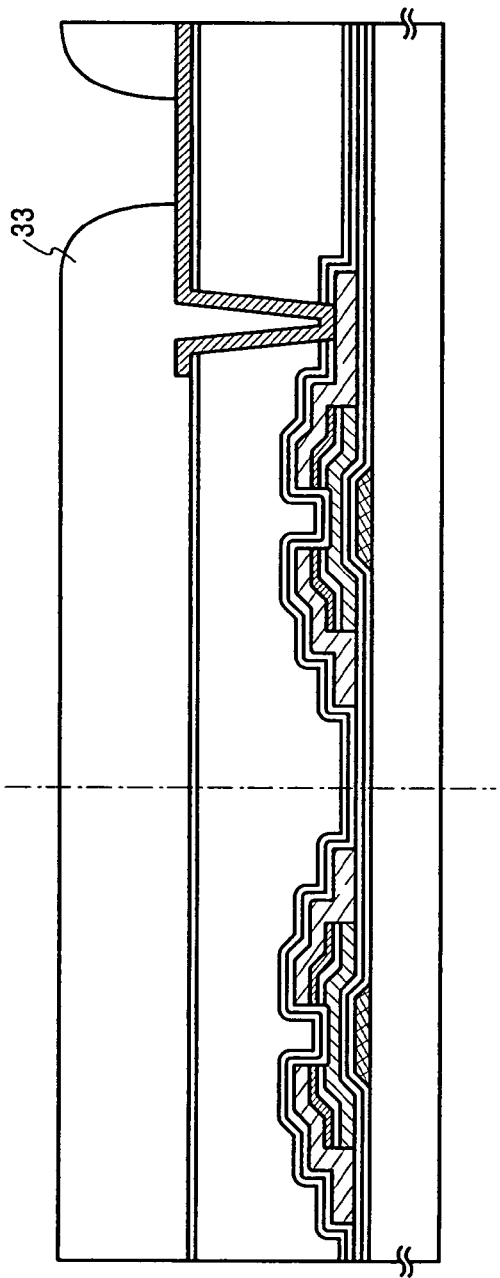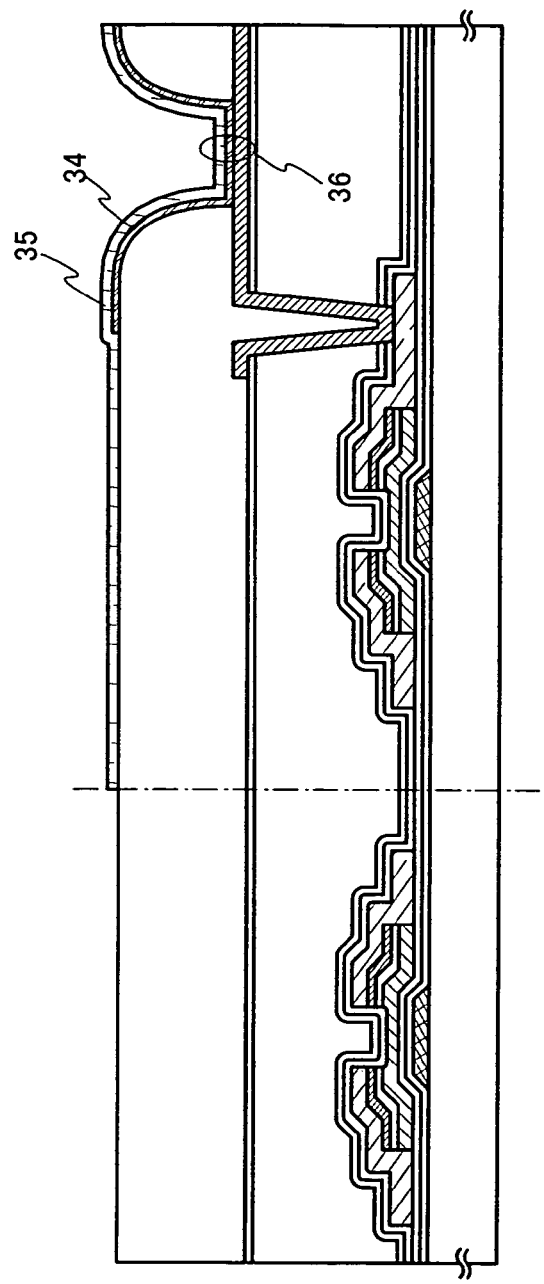
Fig. 10A
Fig. 10B

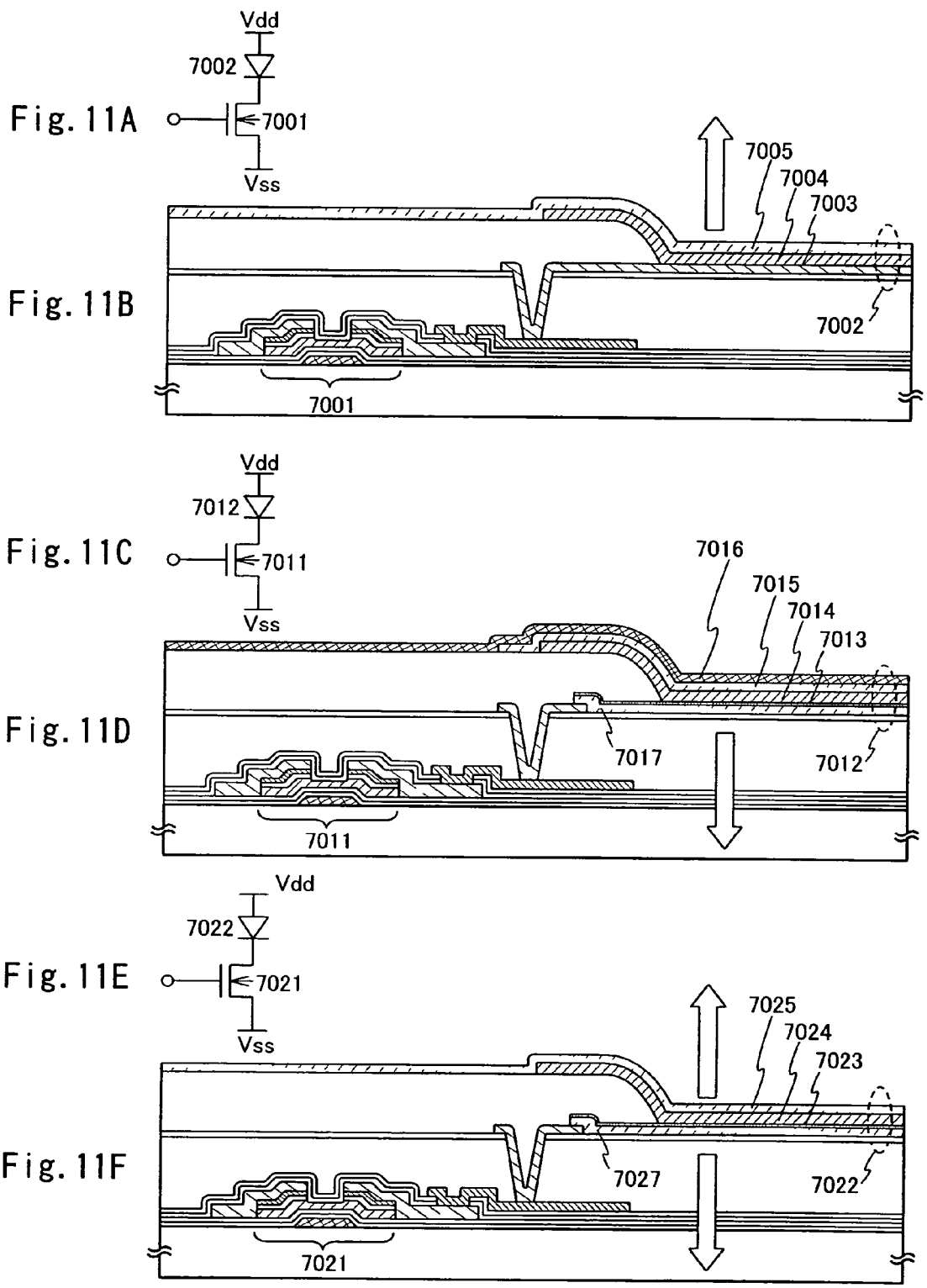

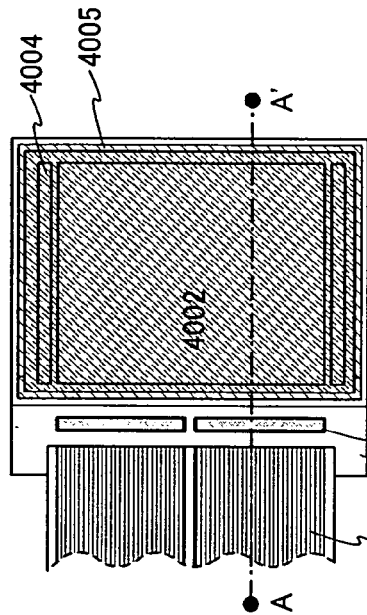
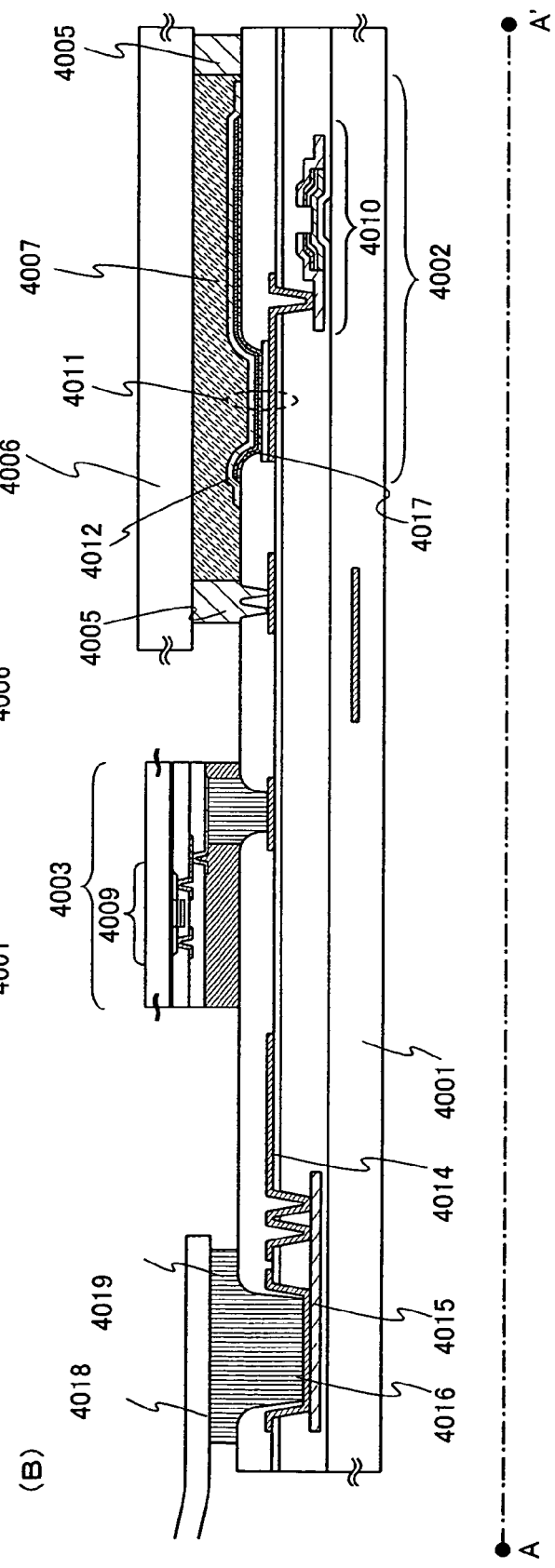
Fig. 15A
Fig. 15B

LIGHT-EMITTING DEVICE

BACKGROUND OF THE INVENTION

1. Field of the Invention

This invention relates to a light-emitting device using a thin film transistor for a drive circuit and a pixel portion.

2. Related Art

In a semiconductor display device formed by using a glass substrate at low cost, the required area for the periphery of a pixel portion (a frame region) for mounting is increased with the increase of screen resolution. Accordingly, the miniaturization of the semiconductor display device tends to be prevented. Therefore, it has been considered that there is a limitation in a method of mounting IC formed by a single crystalline silicon wafer on a glass substrate. Hence, a technique of forming integrally an integrated circuit including a drive circuit over one substrate with a pixel portion, that is, so-called system on panel, has been attracted attention.

A thin film transistor formed by a polycrystalline semiconductor film (polycrystalline TFT) has advantages that the mobility thereof is two orders of magnitude higher than that of a TFT formed by an amorphous semiconductor film, and a pixel portion and a drive circuit around the periphery thereof of a semiconductor display device can be integrally formed over one substrate. However, there are problems that the process becomes complicated due to crystallization of a semiconductor film, yields becomes reduced, and the cost becomes increased compared to the case of using an amorphous semiconductor film.

In the case of performing laser annealing that is used generally for forming a polycrystalline semiconductor film, energy density required for improving crystallinity should be secured. Accordingly, throughput in the process of crystallization is declined and the crystallinity by the edge-neighborhood of a laser beam is varied due to that the longitudinal length of the laser beam has limitations, and so the size of a substrate has limitations. The variation of the energy of laser light causes the variations of the crystallinity of a semiconductor film. There is a problem that it is difficult to laser anneal uniformly a subject.

However, a TFT in which a channel formation region is formed by an amorphous semiconductor film can obtain electric field effect mobility only of approximately from 0.4 to 0.8 $cm^2/Vsec$. Therefore, the TFT can be used as a switching element in a pixel portion, however, the TFT is unsuitable for a drive circuit required for high speed operation such as a scanning line drive circuit for selecting pixels, or a signal line drive circuit for supplying a video signal to the selected pixel.

Especially, in the case of an active matrix light-emitting device among semiconductor devices, at least two transistors, that is, a transistor serving as a switching element for controlling the input of a video signal and a transistor for controlling the supply of current to the light-emitting element are provided in a pixel. The transistor for controlling the supply of current to the light-emitting element is preferably to have higher ON current than that of the transistor used as a switching element. Therefore, the further improvement of the mobility of a TFT in a pixel portion is an important challenge for a light-emitting device.

SUMMARY OF THE INVENTION

In view of the foregoing, it is an object of the present invention to realize system on panel without complicating the process of TFT, and provide a light-emitting device that can be formed by lower cost than that of the conventional light-emitting device.

According to the invention, a thin film transistor (TFT) is formed by using a semiamorphous semiconductor film having an amorphous semiconductor film in which crystal grains are dispersed, and a light-emitting device is manufactured by using the TFT for a pixel portion or a drive circuit. Since the TFT formed by the semiamorphous semiconductor film has mobility of from 2 to 10 $cm^2/Vsec$ that is 2 to 20 times higher than that of a TFT formed by an amorphous semiconductor film, a part of or all of the drive circuit can be integrally formed over one substrate with a pixel portion.

Contrary to a polycrystalline semiconductor film, a semiamorphous semiconductor film (microcrystalline semiconductor film) can be deposited over a substrate. Specifically, $SiH_4$ is diluted by 2 to 1000 times, preferably, 10 to 100 times in flow ratio and deposited by plasma CVD. A semiamorphous semiconductor film manufactured by the foregoing method includes a microcrystalline semiconductor film having an amorphous semiconductor film dispersed with crystal grains of from 0.5 to 20 nm. Therefore, the process of crystallization is not required after forming a semiconductor film contrary to the case of using a polycrystalline semiconductor film. In addition, there is hardly a limitation of a substrate size that is caused by the limitations of the longitudinal length of a laser beam when crystallization is carried out by laser light. The number of the process for manufacturing a TFT can be reduced, and so yields of a light-emitting device can be improved and the cost can be reduced.

According to the invention, a semiamorphous semiconductor film may be used for at least a channel formation region. In addition, the channel formation region is not required to be entirely formed in the thickness direction by semiamorphous semiconductor, and at least a part of the channel formation region may be formed by semiamorphous semiconductor.

A light-emitting device comprises a panel sealed with a light-emitting element and a module provided with the panel mounted with IC or the like including a controller. The invention relates to a device substrate that corresponds to one embodiment in which a light-emitting element is not formed in the process of manufacturing the light-emitting device. A plurality of pixels of the device substrate have a means for supplying current to the light-emitting element, respectively. The device substrate may be any state such as the state that only a pixel electrode of the light-emitting device is provided, or the state that a conductive film is formed as a pixel electrode and the pixel electrode is not patterned to be formed.

An OLED (Organic Light Emitting Diode) that is one of light-emitting elements comprises a layer containing an electroluminescent material (hereinafter, electroluminescent layer) generating luminescence upon applying current (electroluminescence), an anode layer, and a cathode layer. The electroluminescent layer is formed to be interposed between an anode and a cathode, and is formed by a single layer or a lamination layer. Specifically, the electroluminescent layer comprises a hole injecting layer, a hole transporting layer, a light-emitting layer, an electron injecting layer, an electron transporting layer, and the like. Inorganic compounds may be contained in layers composing the electroluminescent layer. Luminescence in the electroluminescent layer occurs from the singlet excited state back down to the ground state (fluorescence) and the triplet excited state back down to the singlet ground state (phosphorescence).

According to the invention, the process of crystallization of a deposited semiconductor film can be omitted, and system on panel of a light-emitting device can be realized without complicating the process of a TFT.

These and other objects, features and advantages of the present invention will become more apparent upon reading of the following detailed description along with the accompanied drawings.

BRIEF DESCRIPTION OF THE INVENTION

FIGS. 2A and 2B are a circuit diagram and a cross-sectional view of a light-emitting device according to the present invention, respectively;

FIGS. 7A to 7C are views for showing a process for manufacturing a light-emitting device according to the invention;

FIGS. 10A and 10B are views for showing a process for manufacturing a light-emitting device according to the invention;

FIGS. 11A to 11F are cross-sectional views for showing a pixel included in a light-emitting device according to the invention;

FIGS. 15A and 15B are a top view and a cross-sectional view for a light-emitting device according to the invention, respectively.

DESCRIPTION OF THE INVENTION

Figure 1:
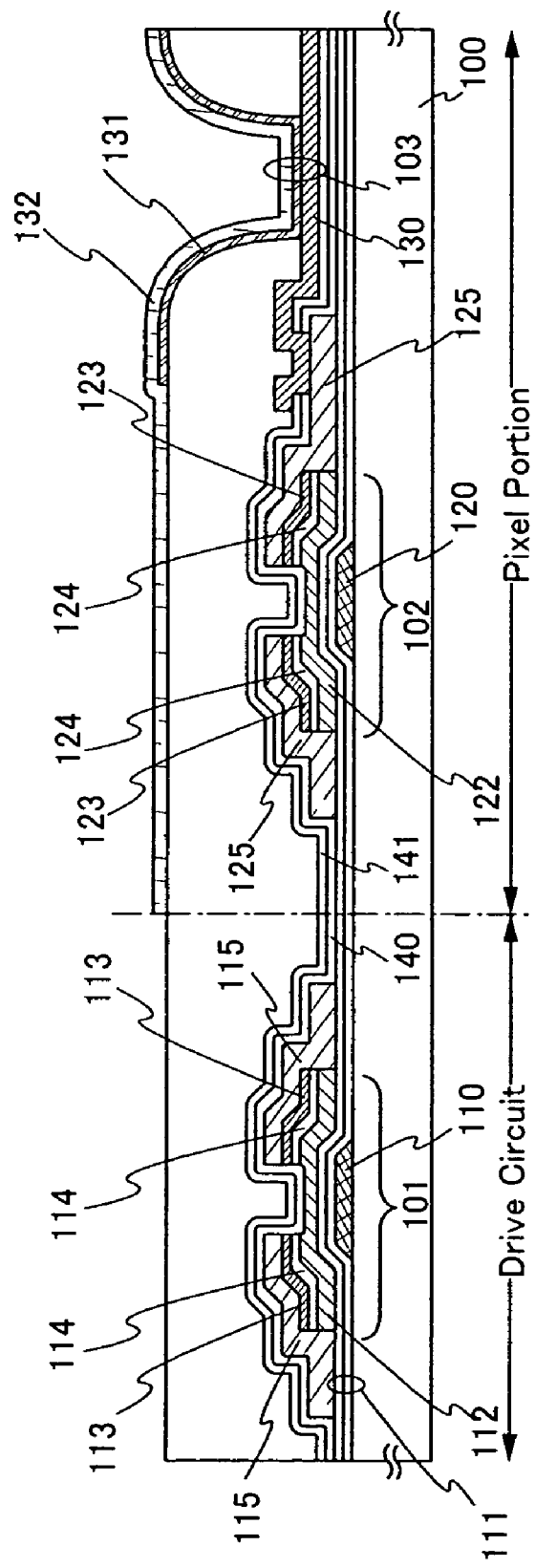
FIG. 1 is a cross-sectional view of a light-emitting device according to the present invention.

A structure of a TFT used in a light-emitting device according to the present invention will be explained hereinafter. FIG. 1 is a cross-sectional view of a TFT used for a drive circuit and a TFT used for a pixel portion. Reference numeral 101 denotes a cross-sectional view of a TFT used for a drive circuit; 102, a cross-sectional view of a TFT used for a pixel portion; and 103, a cross-sectional view of a light-emitting element supplied with a current by the TFT 102. Both of the TFTs 101, 102 are inversed-staggered type (bottom gate type) TFTs. An n-type semiamorphous TFT is more suitable for a drive circuit than a p-type semiamorphous TFT by the reason that the n-type semiamorphous TFT has higher mobility than that of the p-type semiamorphous TFT. In the invention, a TFT may be either n-type or p-type. In either polarity of TFT, TFTs formed over one substrate are preferably formed to have the same polarity for reducing the number of processes.

The TFT 101 of the drive circuit includes a gate electrode 110 formed over a substrate 100, a gate insulating film 111 covering the gate electrode 110, and a first semiconductor film 112 formed by a semiamorphous semiconductor film, which overlaps with the gate electrode 110 via the gate insulating film 111. Further, the TFT 101 includes a pair of second semiconductor films 113 serving as a source region or a drain region, and a pair of third semiconductor films 114 formed between the first semiconductor film 112 and the second semiconductor films 113.

FIG. 1 shows the structure in which the gate insulating film 111 is formed by two layers of an insulating film; however, the invention is not limited thereto. The gate insulating film 111 may be formed by a single layer or three or more layers of an insulating film.

The second semiconductor films 113 are formed by an amorphous semiconductor film or a semiamorphous semiconductor film. Impurities imparting one conductivity type are doped to the second semiconductor films 113. A pair of the second semiconductor films 113 is faced each other via a region for a channel of the first semiconductor film 112.

The third semiconductor films 114 are formed by an amorphous semiconductor film or a semiamorphous semiconductor film. The third semiconductor films 114 have the same conductivity type as that of the second semiconductor films 113. The third semiconductor films 114 have properties of lower conductivity than that of the second semiconductor films 113. The third semiconductor films 114 which serve as an LDD region can relieve electric field concentration at the edge of the second semiconductor films 113 which serve as a drain region to prevent hot carrier effects. However, the third semiconductor films 114 are not always necessarily formed. In case of forming the third semiconductor films 114, pressure resistance and reliability of TFTs can be improved. Further, in case that the TFT 101 is n-type, n-type conductivity can be obtained without adding impurities imparting n-type when the third semiconductor films 114 are formed. Therefore, in case that the TFT 101 is n-type, n-type impurities are not necessarily doped to the third semiconductor films 114. However, impurities imparting p-type are doped to the first semiconductor film provided with a channel to control the conductivity in order to be close to I-type as much as possible.

A wiring 115 is formed on a pair of the second semiconductor films 113.

The TFT 102 of the drive circuit includes a gate electrode 120 formed over a substrate 100, a gate insulating film 111 covering the gate electrode 120, and a first semiconductor film 122 formed by a semiamorphous semiconductor film, which overlaps with the gate electrode 120 via the gate insulating film 111. Further, the TFT 102 includes a pair of second semiconductor films 123 serving as a source region or a drain region, and a pair of third semiconductor films 124 formed between the first semiconductor film 122 and the second semiconductor films 123.

The second semiconductor films 123 are formed by an amorphous semiconductor film or a semiamorphous semiconductor film. Impurities imparting one conductivity type are doped to the second semiconductor films 123. A pair of the second semiconductor films 123 is faced each other via a region to be provided with a channel of the first semiconductor film 122.

The third semiconductor films 124 are formed by an amorphous semiconductor film or a semiamorphous semiconductor film. The third semiconductor films 124 have the same conductivity type as that of the second semiconductor films 123. The third semiconductor films 124 have properties of lower conductivity than that of the second semiconductor films 123. The third semiconductor films 124 which serve as an LDD region can relieve electric field concentration at the edge of the second semiconductor films 123 which serve as a drain region for preventing hot carrier effects. However, the third semiconductor films 124 are not always necessarily formed. In case of forming the third semiconductor films 124, pressure resistance and reliability of TFTs can be improved. Further, in case that the TFT 102 is n-type, n-type conductivity can be obtained without adding impurities imparting n-type when the third semiconductor films 124 are formed. Therefore, in case that the TFT 102 is n-type, n-type impurities are not necessarily doped to the third semiconductor films 124. However, impurities imparting p-type are doped to the first semiconductor film provided with a channel to control the conductivity in order to be close to I-type as much as possible.

A wiring 125 is formed on a pair of the second semiconductor films 123.

A first passivation film 140 and a second passivation film 141, each of which is formed by an insulating film, are formed so as to cover the TFTs 101, 102, and the wirings 115, 125. The passivation film covering the TFTs 101, 102 is not limited to two layers; it may be a single layer or a lamination layer having three or more layers. For example, the first passivation film 140 can be formed by silicon nitride, and the second passivation film 141 can be formed by silicon oxide. By forming the passivation film by silicon nitride or silicon oxynitride, the TFT 101, 102 can be prevented from deteriorating due to moisture or oxygen.

Either edge of the wiring 125 is connected to a pixel electrode 130 of the light-emitting element 103. An electroluminescent layer 131 is formed on the pixel electrode 130. An opposing electrode 132 is formed on the electroluminescent layer 131. In addition, the light-emitting element 103 has an anode and a cathode. Either electrode serves as a pixel electrode and another electrode serves as an opposing electrode.

According to the present invention, the first semiconductor film including a channel formation region is formed by a semiamorphous semiconductor film so that a TFT having higher mobility than that of a TFT formed by amorphous semiconductor film can be obtained. Therefore, a drive circuit and a pixel portion can be formed over one substrate.

Then, the structure of a pixel included in a light-emitting device according to the invention is explained hereinafter. FIG. 2A is a diagram of one embodiment of a circuit in a pixel. FIG. 2B is a cross-sectional view of one embodiment of the pixel corresponding to that shown in FIG. 2A.

Reference numeral 201 in FIGS. 2A and 2B denotes a switching TFT for controlling the input of a video signal to a pixel. Reference numeral 202 denotes a drive TFT for controlling the supply of current to a light-emitting element 203. Specifically, drain current of the drive TFT 202 is controlled depending on an electric potential of a video signal input to a pixel via the switching TFT 201, and the drain current is supplied to the light-emitting element 203. In addition, reference numeral 204 denotes a capacitance element for holding voltage between a gate and a source (hereinafter, gate voltage) when the switching TFT 201 is turned OFF. The capacitance element 204 is not necessarily provided.

Specifically, the gate electrode of the switching TFT 201 is connected to a scanning line G. Either the source region or the drain region of the switching TFT 201 is connected to a signal line S, and another is connected to the gate of the drive TFT 202. Either the source region or the drain region of the drive TFT 202 is connected to a power source line V, and another is connected to a pixel electrode 205 of the light-emitting element 203. Either two electrodes of the capacitance element 204 is connected to the gate electrode of the drive TFT 202, and another is connected to the power source line V.

FIGS. 2A and 2B show a multi-gate structure in which a first semiconductor film is shared by a plurality of TFTs connected with the switching TFT 201 in series and the gate electrode. According to the multi-gate structure, OFF current of the switching TFT 201 can be reduced. Specifically, FIGS. 2A and 2B shows the switching TFT 201 having the structure that two TFTs are connected in series; however, a multi-gate structure may be adopted, in which three or more of TFTs are connected with each other in series, and a gate electrode is connected thereto. Further, the switching TFT is not necessarily formed to have a multi-gate structure. The switching TFT may be a general single gate TFT having a gate electrode and a channel formation region.

Figure 3:
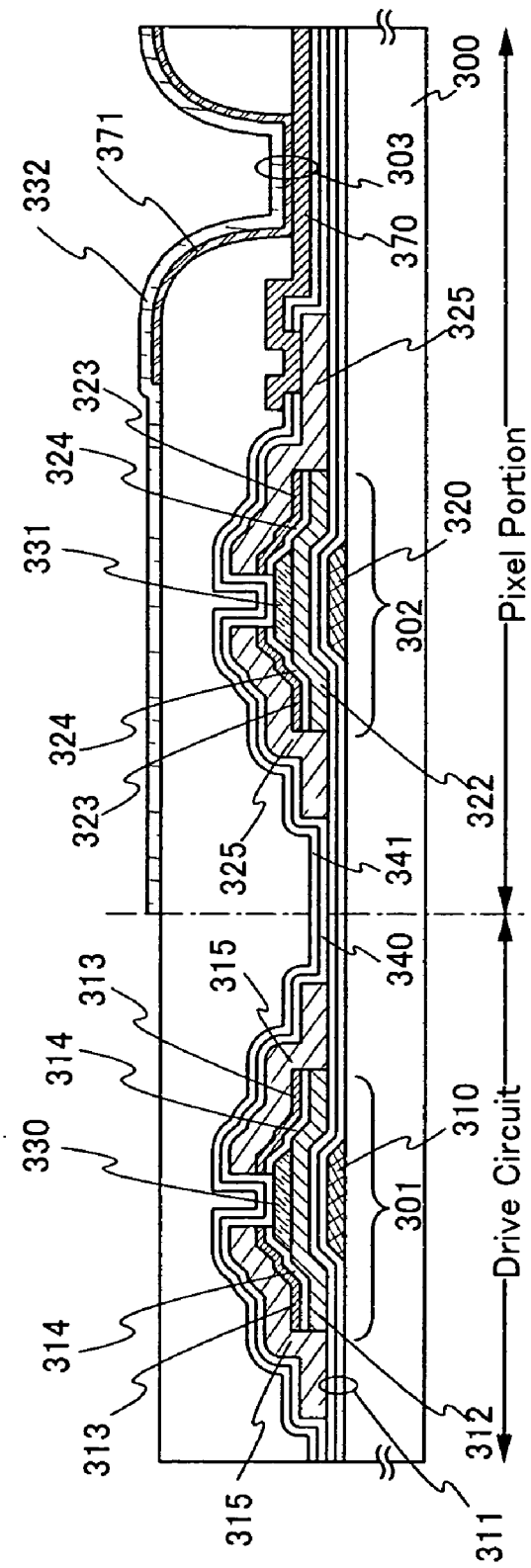
FIG. 3 is a cross-sectional view of a light-emitting device according to the invention.

Then, an embodiment of a TFT included in a light-emitting device according to the invention different from that shown in FIGS. 1, 2A and 2B. FIG. 3 shows a cross-sectional view of a TFT used for a drive circuit and a cross-sectional view of a TFT used for a pixel portion. Reference 301 denotes a cross-sectional view of a TFT used for a drive circuit. Reference numeral 302 denotes a cross-sectional view of a TFT used for a pixel portion, and a cross-sectional view of a light-emitting element 303 supplied with current from the TFT 302.

The TFT 301 in the drive circuit and the TFT 302 in the pixel portion comprise gate electrodes 310, 320 formed over a substrate 300; a gate insulating film 311 covering the gate electrodes 310, 320; and first semiconductor films 312, 322 formed by a semiamorphous semiconductor film, which overlaps with the gate electrodes 310, 320 via the gate insulating film 311, respectively. Channel protective films 330, 331 formed by an insulating film are formed so as to cover the channel formation region of the first semiconductor films 312, 322. The channel protective films 330, 331 are provided to prevent the channel formation region of the first semiconductor films 312, 322 from etching during the process of manufacturing the TFTs 301, 302. The TFT 301 and TFT 302 comprise a pair of second semiconductor films 313, 323 serving as a source region or a drain region; and third semiconductor films 314, 324 formed between the first semiconductor films 312, 322 and the second semiconductor films 313, 323 respectively.

In FIG. 3, the gate insulating film 311 is formed by two layers of insulating films; however, the invention is not limited thereto. The gate insulating film 311 can be formed by a single layer or three or more layers of an insulating film.

The second semiconductor films 313, 323 are formed by an amorphous semiconductor film or a semiamorphous semiconductor film. Impurities imparting one conductivity type are doped to the second semiconductor films 313, 323. Further, the pair of the second semiconductor films 313, 323 face with each other via a region to be provided with a channel.

The third semiconductor films 314, 324, each of which is formed by an amorphous semiconductor film or a semiamorphous semiconductor film, have the same conductivity type as that of the second semiconductor films 313, 323, and have properties of lower conductivity than that of the second semiconductor films 313, 323. The third semiconductor films 314, 324 serve as an LDD region to relieve an electric field concentrated on the edge of the second semiconductor films 313, 323 serving as a drain region. Thus, hot carrier effects can be prevented. The third semiconductor films 314, 324 can enhance the pressure resistance of TFTs to improve reliability thereof; however, the third semiconductor films 314, 324 are not necessarily formed. In case that the TFTs 301, 302 are n-type, n-type conductivity can be obtained without doping n-type impurities during forming the third semiconductor films 314, 324. Therefore, in case that the TFTs 301, 302 are n-type, n-type impurities are not necessarily doped to the third semiconductor films 314, 324. However, impurities imparting p-type are doped to the first semiconductor film provided with a channel to control the conductivity in order to be close to I-type as much as possible.

Wirings 315, 325 are formed over the pair of second semiconductor films 313, 323, respectively.

A first passivation film 340 and a second passivation film 341, both of which are formed by an insulating film, are formed so as to cover the TFTs 301, 302, and wirings 315, 325. The passivation film covering the TFTs 301, 302 is not limited to two layers. The passivation film can be formed by a single layer, or three or more layers. For example, the first passivation film 340 can be formed by silicon nitride, and the second passivation film 341 can be formed by silicon oxide. By forming the passivation film by silicon nitride or silicon oxynitride, the TFTs 301, 302 can be prevented from deteriorating due to moisture or oxygen.

Either edge of the wiring 325 is connected to a pixel electrode 370 of the light-emitting element 303. An electroluminescent layer 371 is formed on the pixel electrode 370. An opposing electrode 332 is formed on the electroluminescent layer 371. Further, the light-emitting element 303 has an anode and a cathode. Either the anode and the cathode is used as a pixel electrode, and another is used as an opposing electrode.

Then, the structure of a device substrate used for a light-emitting device according to the invention.

Figure 4:
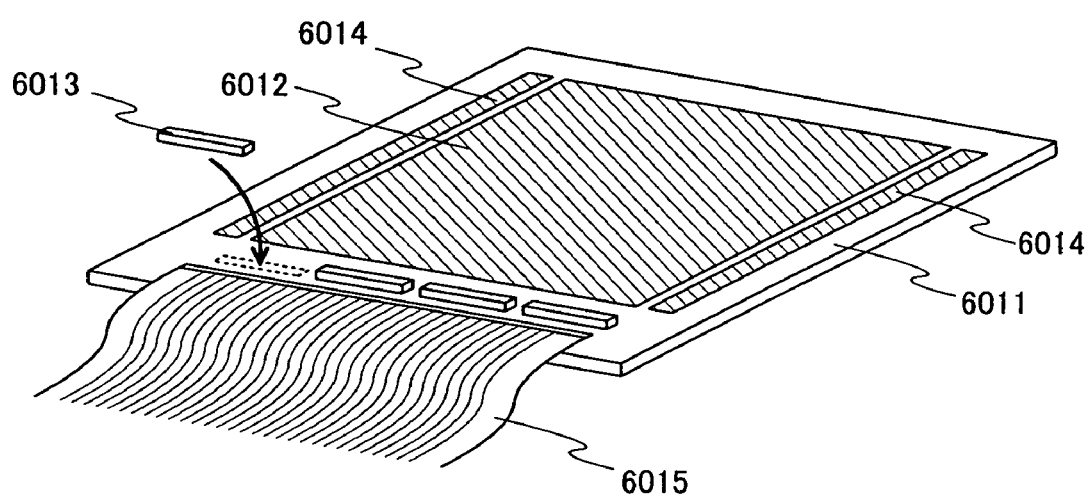
FIG. 4 shows an embodiment of a device substrate according to the invention.

FIG. 4 shows one embodiment in which only a signal line drive circuit 6013 is separately formed, and a device substrate is connected to a pixel portion 6012 formed over a substrate 6011. The pixel portion 6012 and a scanning line drive circuit 6014 are formed by a semiamorphous TFT. By forming the signal line drive circuit by a transistor having higher mobility than that of a semiamorphous TFT, the operation of the signal line drive circuit that is required to have higher drive frequency than that of the scanning line drive circuit can be stabilized. Further, the signal line drive circuit may be a transistor formed by a single crystal, a TFT formed by a poly crystal, or a transistor formed by SOI. An electric potential of a power source, various signals, and the like are supplied to the pixel portion 6012, the signal line drive circuit 6013, and the scanning line drive circuit 6014, respectively via an FPC 6015.

The signal line drive circuit and the scanning line drive circuit can be formed with a pixel portion over one substrate.

Figure 5A:
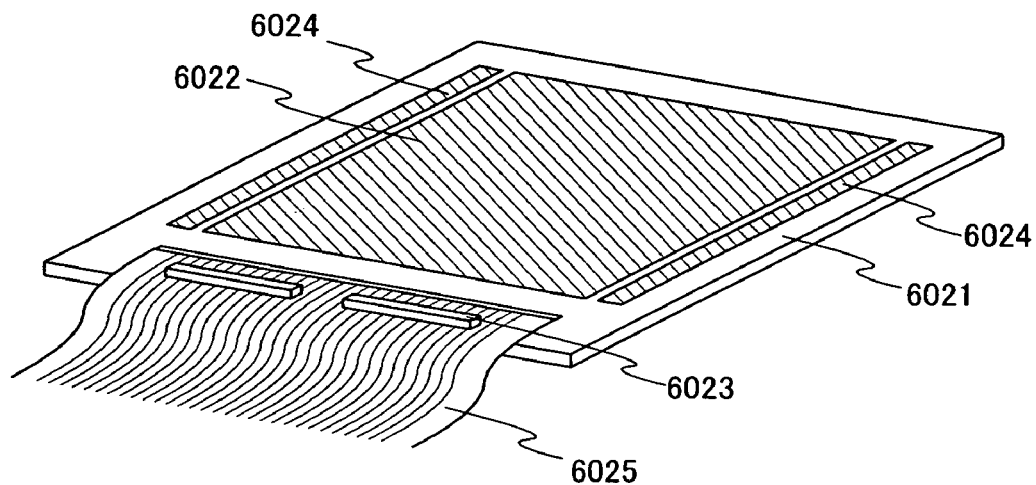
FIGS. 5A and 5B show embodiments of a device substrate according to the invention.

In the case that a drive circuit is formed separately, a substrate provided with a drive circuit is not necessarily pasted onto a substrate provided with a pixel portion. For example, the substrate may be pasted onto an FPC. FIG. 5A shows one embodiment in which only a signal line drive circuit 6023 is separately formed, and a device substrate is connected to a pixel portion 6022 and a scanning line drive circuit 6024, both of which are formed over a substrate 6021. The pixel portion 6022 and the scanning line drive circuit 6024 are formed by a semiamorphous TFT. The signal line drive circuit 6023 is connected to the pixel portion 6022 via an FPC 6025. An electric potential of a power source, various signals, and the like are supplied to the pixel portion 6022, the signal line drive circuit 6023, and the scanning line drive circuit 6024, respectively via an FPC 6025.

Figure 5B:
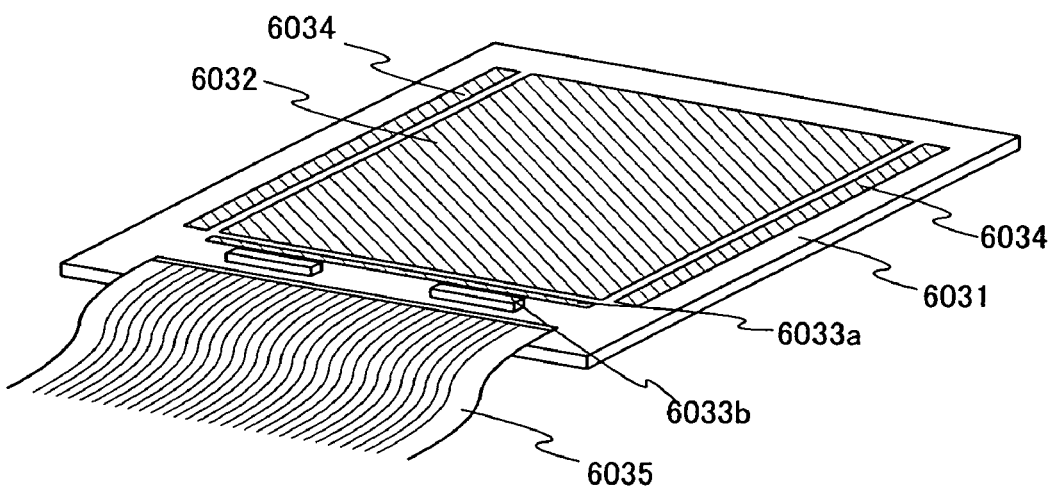

Alternatively, a part of a signal line drive circuit and a part of a scanning line drive circuit may be formed by a semiamorphous TFT over one substrate with a pixel portion. The rest of the signal line drive circuit and the scanning line drive circuit may be formed separately to connect electrically to a pixel portion. FIG. 5B shows one embodiment in which an analog switch 6033 included in a signal line drive circuit is formed over a substrate 6031 together with a pixel portion 6032 and a scanning line drive circuit 6034, and a shift register 6033b included in a signal line drive circuit is separately formed over a different substrate to be pasted onto the substrate 6031. The pixel portion 6032 and the scanning line drive circuit 6034 are formed by a semiamorphous TFT. The shift register 6033b included in the signal line drive circuit is connected to the pixel portion 6032 via an FPC 6035. An electric potential of a power source, various signals, and the like are supplied to the pixel portion 6032, the signal line drive circuit, and the scanning line drive circuit, respectively via an FPC 6025.

As shown in FIGS. 4, 5A and 5B, a part of or all of the drive circuit of a light-emitting device according to the invention can be formed by a semiamorphous TFT over one substrate with a pixel portion.

The method of the connection of the substrate formed separately is not limited especially; a known COG method, a wire bonding method, a TAB method, or the like can be applied. The position to be connected with the substrate is not limited to that illustrated in FIGS. 4, 5A and 5B in case that electrical connection is possible. Alternatively, a controller, a CPU, a memory, and the like may be separately formed to be connected to a substrate.

A signal line drive circuit used in the invention is not limited to an embodiment in which the signal line drive circuit includes only a shift register and an analog switch. Besides the shift register and the analog switch, other circuits such as a buffer, a level shifter, and a source follower may be included. Further, the shift register and the analog switch are not necessarily formed, another circuit such as a decoder circuit capable of selecting a signal line can be used instead of the shift register, or latch or the like can be used instead of the analog switch.

Figure 6A:
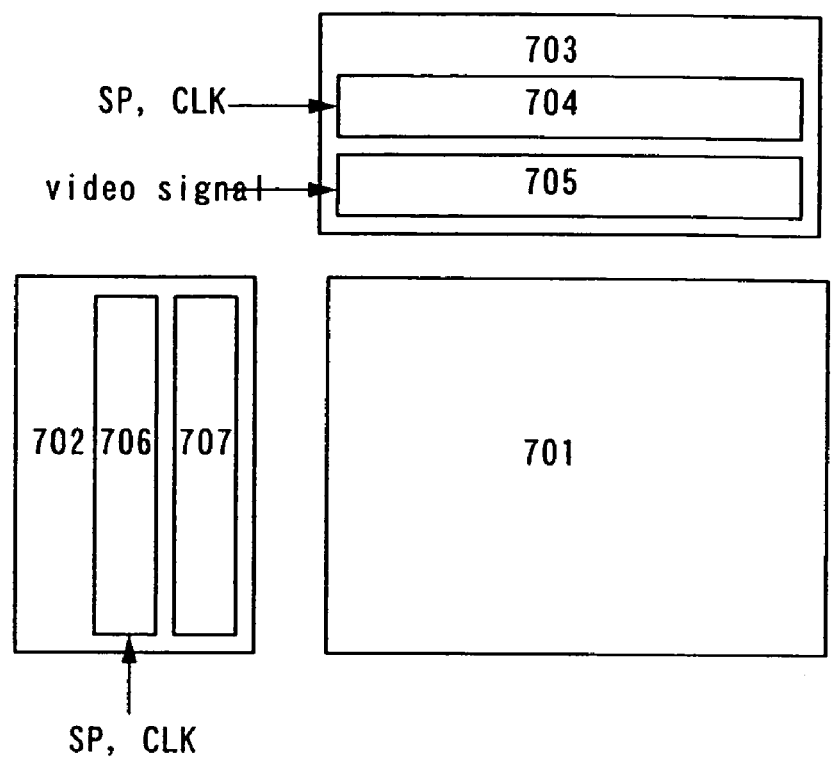
FIGS. 6A and 6B are block diagrams for showing a structure of a light-emitting device according to the invention.

FIG. 6A is a block diagram for showing a light-emitting device according to the invention. A light-emitting device shown in FIG. 6A comprises a pixel portion 701 including a plurality of pixels provided with a light-emitting element; a scanning line drive circuit 702 for selecting each pixel; and a signal line drive circuit 703 for controlling the input of a video signal into a selected pixel.

The signal line drive circuit 703 illustrated in FIG. 6A includes a shift register 704 and an analog switch 705. A clock signal (CLK) and a start pulse signal (SP) are input into the shift register 704. Upon inputting the clock signal (CLK) and the start pulse signal (SP), a timing signal is generated in the shift register 704 to be input into the analog switch 705.

A video signal is fed to the analog switch 705. The analog switch 705 samples the video signal depending on the input timing signal to supply the sampled video signal to a signal line at a subsequent stage.

Then, the structure of a scanning line drive circuit 702 is explained. The scanning line drive circuit 702 includes a shift register 706 and a buffer 707. The scanning line drive circuit 702 may include a level shifter in some instances. Upon inputting a clock signal (CLK) and a start pulse signal (SP) to the shift register 706, a selecting signal is generated in the scanning line drive circuit 702. The generated selecting signal is buffered and amplified in the buffer 707 to be supplied to a corresponding scanning line. The scanning line is connected with the gate of a transistor of a pixel per one line. In order to turn the transistor of a pixel per one line ON simultaneously, a buffer capable of flowing a large amount of current is used as the buffer 707.

In the case that a video signal corresponding to R (red), G (green), B (blue) is sampled to be supplied to a corresponding signal line in a full color light-emitting device, the number of terminals for connecting the shift register 704 to the analog switch 705 is approximately ⅓ of the number of terminals for connecting the analog switch 705 to the signal line of the pixel portion 701. Therefore, by forming the analog switch 705 over one substrate with the pixel portion 701, the generation ratio of connection inferiors can be reduced, the yields can be improved, and the number of terminals used for connecting a substrate formed separately can be reduced compared with the case that the analog switch 705 and the pixel portion 701 are respectively formed over separate substrates.

Figure 6B:
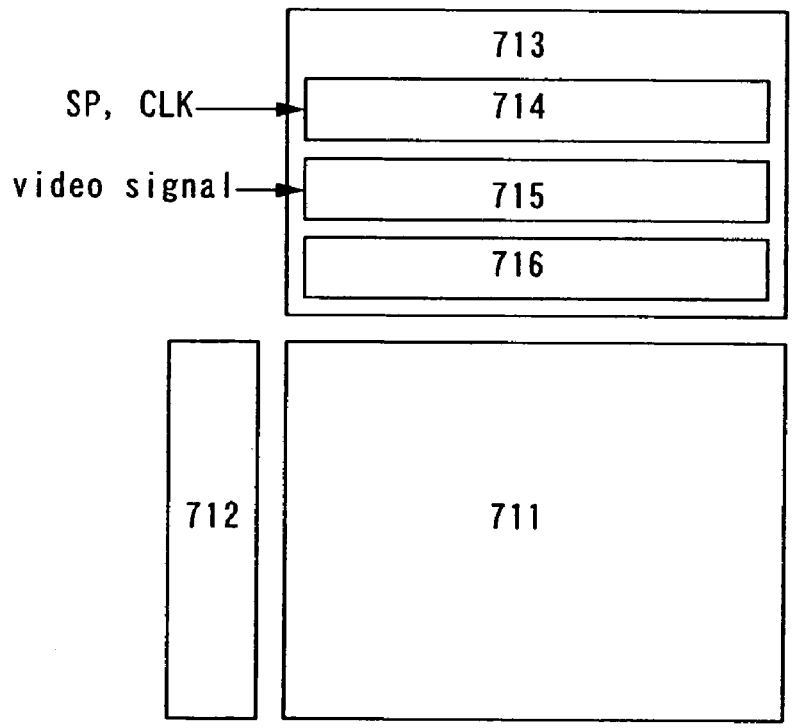

FIG. 6B is a block diagram for showing a light-emitting device according to the invention, which is different from that shown in FIG. 6A. A signal line drive circuit 713 illustrated in FIG. 6B includes a shift register 714, a latch A 715, and a latch B 716. The scanning line drive circuit 712 has the same structure as that shown in FIG. 6A.

A clock signal (CLK) and a start pulse (SP) are input to the shift register 714. Upon inputting the clock signal (CLK) and the start pulse (SP), a timing signal is generated in the shift register 714 to be supplied to the latch A 715 at the first stage. Upon inputting the timing signal to the latch A 715, a video signal is sequentially written in the latch A 715 in synchronization with the timing signal to be held. Further, the video signal is sequentially written in the larch A 715 in FIG. 6B; however, the invention is not limited to this instance. So-called divisional drive can be performed, that is, the latch A 715 at a plurality of stages is partitioned in some groups to input a video signal to each group in parallel with each other. In addition, the number of group is referred to as the number of partition. For example, the case that the latch is partitioned into some groups per four stages is referred to as partition drive by four-partition.

The time required for completing the write of a video signal to a latch at all stages is referred to as a line period. Practically, the line period may be added with a horizontal retrace period.

Upon completing one line period, a latch signal is supplied to the latch B 716 at a second state, and a video signal held in the latch A 715 is written in synchronization with the latch signal to be held in the latch B 716. In the latch A 715 which completes the send of a video signal to the latch B 716, a next video signal is sequentially written in synchronization with the timing signal from the shift register 714. During the second one line period, a video signal written and held in the latch B 716 is input into a signal line.

The structure illustrated in FIGS. 6A and 6B is an embodiment illustrative only of a light-emitting device according to the invention. The structures of the signal line drive circuit and the scanning line drive circuit are not limited to those shown in FIGS. 6A and 6B.

Next, a specific method for manufacturing a light-emitting device according to the invention is explained.

As a substrate 10, a material of plastic can be used besides glass, quartz, or the like. Alternatively, a metal material such as stainless, aluminum, or the like coated with an insulating film can be used as the substrate 10. A first conductive film 11 is formed for forming a gate electrode and a gate wiring (scanning line) over the substrate 10. As the first conductive film 11, a metal material such as chrome, molybdenum, titanium, tantalum, tungsten, aluminum, or the like or an alloy of the metal material is used. (FIG. 7A)

The first conductive film 11 is etched to form gate electrodes 12, 13. The edges of the gate electrodes are preferably formed to have a tapered shape since a first semiconductor film or a wiring layer is formed over the gate electrodes. In the case that the first conductive film 11 is formed by a material mainly containing aluminum, the surface of the first conductive film 11 is preferably insulated by anode oxidization after etching process. Further, a wiring connected to the gate electrode can be formed simultaneously according to the process (not shown). (FIG. 7B)

A first insulating film 14 and a second insulating film 15 can serve as a gate insulating film by forming over the gate electrodes 12, 13. In this instance, the first insulating film 14 is preferably formed as a silicon oxide film, and the second insulating film 15 is preferably formed as a silicon nitride film. These insulating films can be formed by grow discharge decomposition or sputtering. Especially, for forming a dense insulating film with a small amount of gate leak current at low temperature, a rare gas element such as argon is included in a reaction gas to be mixed into the insulating film.

Then, a first semiconductor film 16 is formed over such the first and the second insulating films. The first semiconductor film 16 is formed by a film containing semiconductor having intermediate structure between an amorphous structure or crystalline structure (including single crystals and poly crystals). The semiconductor has a stable third state with respect to free energy, and is crystalline having a short-range order and lattice distortion. The semiconductor can be formed to have a grain diameter of from 0.5 to 20 nm to disperse in amorphous semiconductor. Further, at least one atomic % or more of hydrogen or halogen is included in the semiconductor as neutralizer for dangling bonds. Hereinafter, such semiconductor is referred to as semiamorphous semiconductor (SAS) for the sake of convenience. Further, by mixing a rare gas element such as helium, argon, krypton, neon, or the like into the SAS to enhance the lattice distortion, a favorable SAS having good stability can be obtained. The SAS is disclosed in U.S. Pat. No. 4,409,134, for example. (FIG. 7C)

The SAS can be obtained by a silicide gas subjected to grow discharge decomposition. As a typical silicide gas, $SiH_4$ can be used. Other silicide gas such as $Si_2H_6$, $SiH_2Cl_2$, $SiHCl_3$, $SiCl_4$, $SiF_4$, or the like can be used. The SAS can be formed easily by diluting the silicide gas with a rare gas element selected from the group consisting of hydrogen, hydrogen and helium, argon, krypton, and neon. The dilution rate is preferably in the range of from 10 to 1000 times. Of course, a reaction product for a film is formed by grow discharge decomposition at a reduced pressure in the range of approximately from 0.1 to 133 Pa. High frequency current of from 1 to 120 MHz, preferably, from 13 to 60 MHz may be supplied for forming grow discharge. A temperature for heating a substrate is preferably at most 300° C., more preferably, from 100 to 200° C.

An energy band width may be controlled to be from 1.5 to 2.4 eV, or from 0.9 to 1.1 eV by mixing a carbide gas such as $CH_4$ or $C_2H_6$, or a germanium gas such as $GeH_4$ or $GeF_4$ into the silicide gas.

The SAS shows weak n-type electrical conductivity when impurities are not doped deliberately in order to control a valency electron. Therefore, it becomes possible that a threshold value can be controlled by doping p-type impurities into the first semiconductor film provided with a channel formation region for a TFT simultaneously with or after the formation of the film. As impurities imparting p-type, boron can be typically used. An impurity gas of from 1 to 1000 ppm such as $B_2H_6$ or $BF_3$ may be mixed into a silicide gas. The boron may have a concentration of from $1\times10^{14}$ to $6\times10^{16}$ atoms/$cm^3$.

Figure 8A:
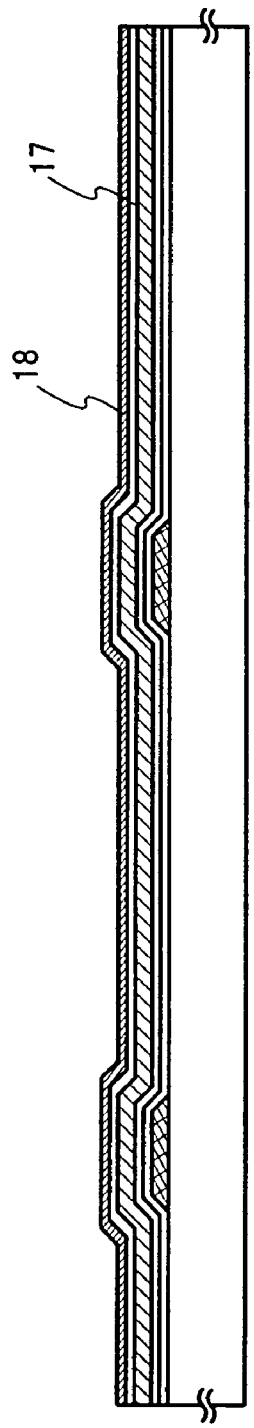
FIGS. 8A to 8C are views for showing a process for manufacturing a light-emitting device according to the invention.

As shown in FIG. 8A, a second semiconductor film 17 is formed. The second semiconductor film 17 is formed deliberately without doping impurities for controlling a valency electron, and is formed preferably by a SAS as in the case with the first semiconductor film 16. The second semiconductor film 17 is formed to be interposed between the first semiconductor film 16 and a third semiconductor film 18 imparting one conductivity type for forming a source and a drain, and so the second semiconductor film 17 serves as a buffer layer. Therefore, the second semiconductor film 17 is not necessarily formed, in case that the third semiconductor film 18 imparting one conductivity type that is the same as that of the first semiconductor film 16 with a weak n-type electric conductivity. The second semiconductor film 17 can vary step-wise impurity concentration in case that impurities imparting p-type are doped to control a threshold value. Accordingly, the second semiconductor film 17 becomes preferable embodiment to improve junction. Hence, a TFT to be formed can serve as a low concentration impurity region (LDD region) that is formed between a channel formation region and a source or a drain region.

In case that an n-channel type TFT is formed, the third semiconductor film 18 imparting one conductivity type may be added with phosphorous as a typical impurity element, and a silicide gas may be added with an impurity gas such as $PH_3$. The third semiconductor film 18 imparting one conductivity type cane be formed by semiconductor such as a SAS, amorphous semiconductor, or fine crystalline semiconductor.

As noted above, the process for forming the first insulating film 14 to the third semiconductor film 18 imparting one conductivity type can be carried out without exposing to the air. Therefore, the variation of TFT characteristics can be reduced since each lamination interface can be formed without being contaminated by contaminated impurity elements suspended in an atmospheric constituent or an atmosphere.

Figure 8B:
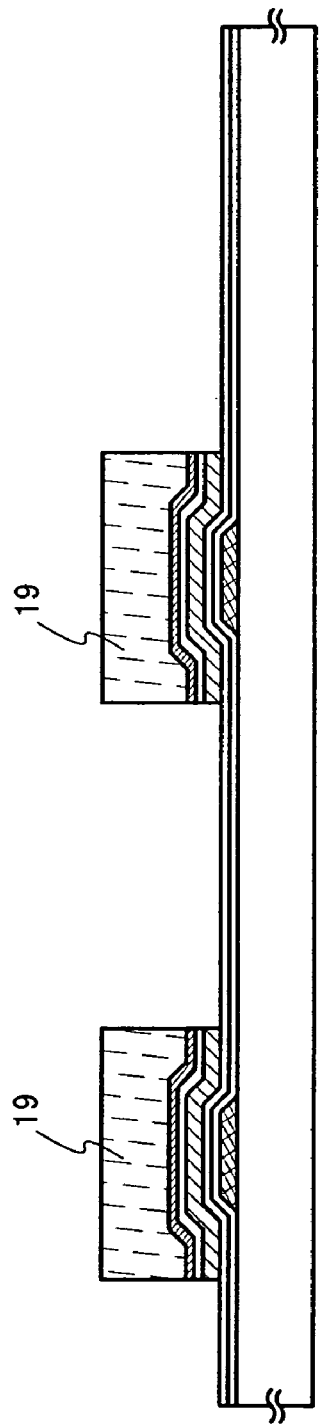

Then, a mask 19 is formed by a photoresist, and then, the first semiconductor film 16, the second semiconductor film 17, and the third semiconductor film 18 imparting one conductivity type are etched to be formed separately in island-like shapes. (FIG. 8B)

Figure 8C:
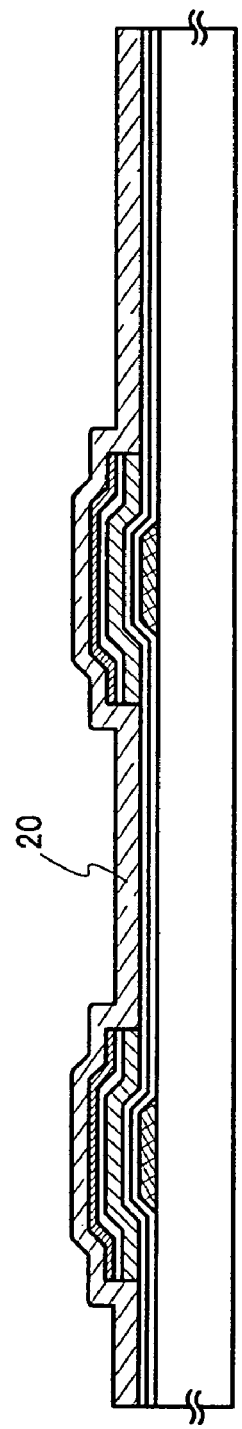

Thereafter, a second conductive film 20 is formed to form a wiring connecting with a source and a drain. The second conductive film 20 is formed by aluminum or a conductive material containing mainly aluminum. The layer formed on a semiconductor film may be formed by a lamination layer comprising titanium, tantalum, molybdenum, tungsten, copper, or nitrides of the foregoing elements. For example, the second conductive film 20 may be formed to have the structure in which the first layer is formed by Ta, and the second layer is formed by W; the first layer is formed by TaN, the second layer is formed by Cu; or the first layer is formed by Ti, the second layer is formed by Al, and the third layer is formed by Ti. Further, AgPdCu alloys may be used to either the first layer or the second layer. Alternatively, a three lamination layer can be formed as the second conductive film 20 comprising W, alloys of Al and Si (Al—Si alloy), and TiN sequentially. Tungsten nitride can be used instead of the W, an alloy film of Al and Ti (Al—Ti film) can be used instead of the Al—Si film, and Ti can be used instead of the TiN. An element of from 0.5 to 5 atom % such as titanium, silicon, scandium, neodymium, copper, or the like may be added. (FIG. 8C)

Figure 9A:
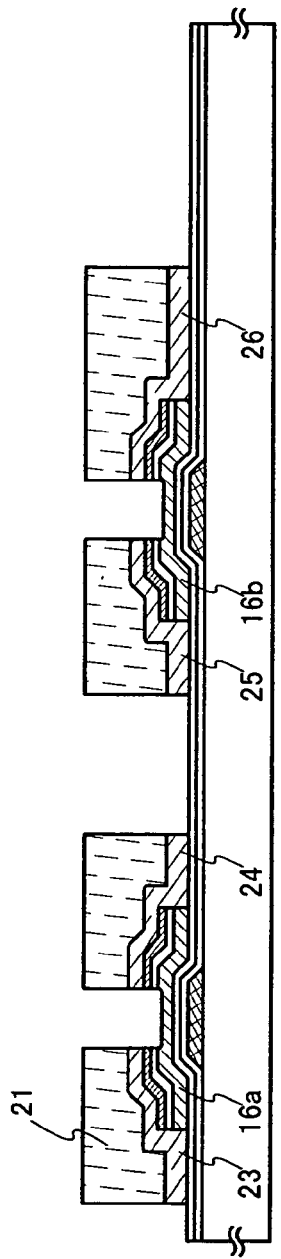
FIGS. 9A to 9C are views for showing a process for manufacturing a light-emitting device according to the invention.

A mask 21 is formed. The mask 21 is formed by pattern formation to form a wiring connecting a source and a drain. The mask 21 serves as an etching mask to form a channel formation region, source and drain regions and LDD regions by removing the second semiconductor film 17 and the third semiconductor film 18 imparting one conductivity type. Aluminum or a conductive film containing mainly aluminum may be etched by using a chloride gas such as $BCl_3$, $Cl_2$, or the like. Wirings 23 to 26 are formed by the etching treatment. Further, etching treatment for forming a channel formation region is carried out by using a fluoride gas such as $SF_6$, $NF_3$, $CF_4$, or the like. In this case, there is hardly difference of an etching rate from that of the first semiconductor film 16 serving as a base film. Accordingly, the time required for the etching is appropriately controlled. As noted above, the structure of a channel etch type TFT can be formed. (FIG. 9A)

A third insulating film 27 for protecting a channel formation region is formed by a silicon nitride film. The silicon nitride film, which can be formed by sputtering or grow discharge decomposition, is required to prevent contaminated impurities such as organic materials, metallic materials, moisture suspended in an atmosphere from penetrating into the channel formation region. Accordingly, the silicon nitride film is required to be a dense film. By using the silicon nitride film as the third insulating film 27, oxygen concentration can be set at most $5\times10^{19}$ atoms/cm$^3$, preferably, at most $1\times10^{19}$ atoms/cm$^3$ in the first semiconductor film 16. A silicon nitride film formed by high frequency sputtering with a silicon target using a sputtering gas of nitrogen and a rare gas element such as argon is promoted to be dense by including a rare gas element. A silicon nitride film formed by diluting a silicide gas with an inactive gas such as argon by 100 to 500 times by grow discharge decomposition is preferable since the silicon nitride film can be formed to be dense at low temperature of at most 100° C. If necessary, a fourth insulating film 28 may be formed by a lamination layer by a silicon oxide film. The third insulating film 27 and the fourth insulating film 28 serve as a passivation film.

Figure 9B:
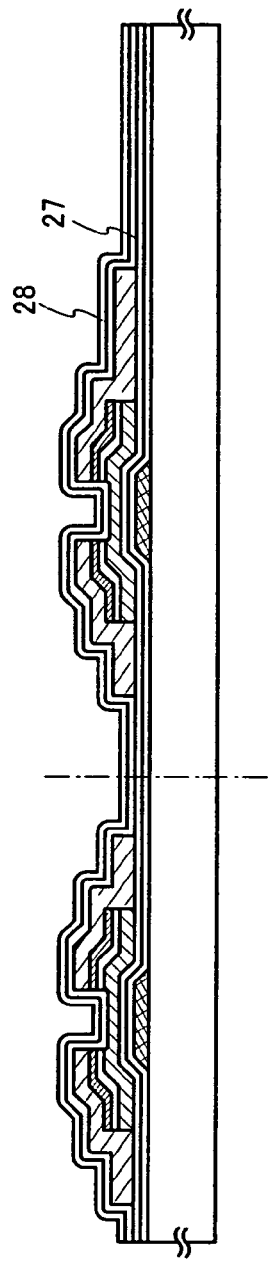

A fifth insulating film 29 which is a planarized film is preferably formed over the third insulating film 27 and the fourth insulating film 28. As the planarized film, organic resin such as acryl, polyimide, polyamide, or the like; or an insulating film containing Si—O bond and Si—$CH_x$ bond formed by using siloxane material as a start material is preferably used. Since these materials are hydroscopic, a sixth insulating film 30 is preferably formed as a barrier film to prevent moisture from penetrating and discharging. As the sixth insulating film 30, the foregoing silicon nitride film may be used. (FIG. 9B)

A pixel electrode 31 is formed after forming a contact hole for the sixth insulating film 30, the fifth insulating film 29, the third insulating film 27, and the fourth insulating film 28. (FIG. 9C)

Thus formed channel etch type TFT can obtain an electric field mobility of from 2 to 10 cm$^2$ Vsec by forming the channel formation region by a SAS. Therefore, the TFT can be used as a switching element for a pixel, and an element for forming a drive circuit at a scanning line (a gate line) side.

As noted above, a switching element for a pixel and a drive circuit at a scanning line side can be formed by one TFT, and a device substrate can be formed by five masks, a gate electrode formation mask, a semiconductor region formation mask, a wiring formation mask, a contact hole formation mask, and a pixel electrode formation mask.

Figure 9C:
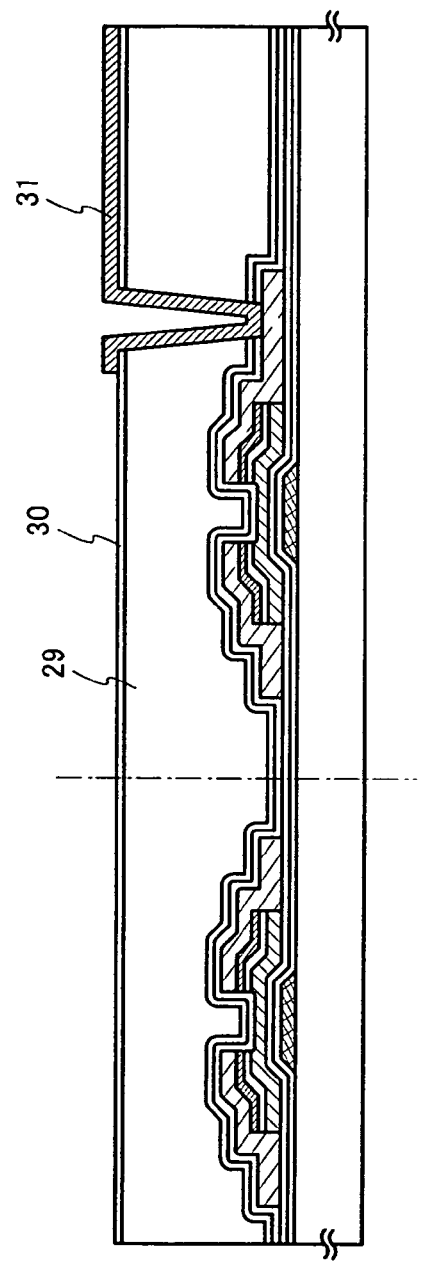

In FIG. 9C, a cathode is preferably used as the pixel electrode 31 since a TFT of a pixel is n-type. In case that the TFT of the pixel is p-type, an anode is preferably used. Specifically, a known material having small work functions such as Ca, Al, CaF, MgAg, AlLi, or the like can be used.

As shown in 10A, a bank 33 is formed by an organic resin film, an inorganic insulating film, or an organic poly siloxane over the sixth insulating film 30. The bank 33 has as opening portion where the pixel electrode 31 is exposed. Then, as shown in FIG. 10B, an electroluminescent layer 34 is formed on the pixel electrode in the opening portion. The electroluminescent layer 34 may be formed by a single layer or a lamination layer. In case that the electroluminescent layer 34 is formed by a lamination layer, the electroluminescent layer 34 is formed by stacking sequentially an electron injecting layer, an electron transporting layer, a light-emitting layer, a hole transporting layer, and a hole injecting layer over the pixel electrode 31 using a cathode.

An opposing electrode 35 using an anode is formed to cover the electroluminescent layer 34. As the opposing electrode 35, a transparent conductive film formed by mixing 2 to 20% of zinc oxide (ZnO) into indium oxide can be used, besides ITO, IZO, or ITSO. As the opposing electrode 35, a titanium nitride film or a titanium film may be used besides the foregoing transparent conductive film. For planarization of the surface, the opposing electrode 35 may be polished by CMP or wiping by a polyvinyl alcohols porous material. After polishing by CMP, the surface of the opposing electrode 35 may be subjected to UV irradiation or oxygen plasma treatment. A light-emitting element 36 is formed by the overlap of the pixel electrode 31, the electroluminescent layer 34, and the opposing electrode 35.

Practically, after completing the process shown in FIG. 10B, a high hermetic protecting film (a laminate film, a ultraviolet curing resin film, or the like) hardly discharging gas or a cover member is preferably used to package the light-emitting element for avoiding exposure to the outside air.

A method for manufacturing the TFT having the structure shown in FIG. 1 is illustrated in FIGS. 7A to 10B. A TFT having the structure shown in FIG. 3 can be simultaneously formed. However, the TFT shown in FIG. 3 is distinguished from that shown in FIGS. 7A to 10B by the fact that the channel protective films 330, 331 are formed to overlap with the gate electrodes 310, 320 over the first semiconductor films 312, 322 formed by a SAS.

In FIGS. 1 and 3, after forming a contact hole for the third insulating film (first passivation film) and the fourth insulating film (second passivation film), the pixel electrode is formed, and the bank is formed. As the bank, organic resin such as acryl, polyimide, polyamide, or the like; or an insulating film containing Si—O bond and Si—$CH_x$ bond formed by using siloxane material as a start material may be used. More specifically, the bank is preferably formed by a photosensitive material to form an opening portion over the pixel electrode. The edge of the opening portion has preferably an inclined plane with a contiguous radius of curvature.

EXAMPLE 1

A semiamorphous TFT that can be used in the present invention can be either n-type or p-type. The semiamorphous TFT is preferably n-type since an n-type semiamorphous TFT has high mobility and is suitable for using as a pixel of a light-emitting device. In this example, a cross-sectional structure of a pixel is explained using an example of an n-type drive TFT.

FIG. 11B is a cross-sectional view of a pixel used in the case that a drive TFT 7001 is n-type, and light generated in a light-emitting element 7002 emits passing through an anode 7005. In FIGS. 11A and 11B, a cathode 7003 of the light-emitting element 7002 and the drive TFT 7001 are electrically connected each other. An electroluminescent layer 7004 and an anode 7005 are sequentially stacked over the cathode 7003. As the cathode 7003, a known material can be used as long as it is a conductive film having small work function and reflects light. For example, Ca, Al, CaF, MgAg, AlLi, or the like is preferably used. The electroluminescent layer 7004 may be formed by a single layer or a lamination layer. In case that the electroluminescent layer 7034 is formed by a lamination layer, the electroluminescent layer 7004 is formed by stacking sequentially an electron injecting layer, an electron transporting layer, a light-emitting layer, a hole transporting layer, and a hole injecting layer over the cathode 7003. As the anode 7005, a transparent conductive film that is transparent to light formed by mixing 2 to 20% of zinc oxide (ZnO) into indium oxide can be used, besides ITO, IZO, or ITSO.

The light-emitting element 7002 corresponds to the overlap region of the cathode 7003, the electroluminescent layer 7034, and the anode 7005. In the pixel shown in FIG. 11B, light generated in the light-emitting element 7002 emits passing through the anode 7005 as denoted by an outline arrow.

FIG. 11D is a cross-sectional view of a pixel used in the case that a drive TFT 7011 is n-type, and light generated in a light-emitting element 7012 emits passing through a cathode 7013. In FIGS. 11C and 11D, the cathode 7013 of the light-emitting element 7012 is formed over a transparent conductive film 7017 connected electrically to the drive TFT 7011, and an electroluminescent layer 7014 and an anode 7015 are formed sequentially over the cathode 7013. A light-shielding film 7016 for reflecting or shielding light in order to cover the anode 7015 is formed. As the cathode 7013, a known conductive film can be used as long as it has small work function and reflects light as in the case with FIGS. 11A and 11B. The cathode 7013 is formed to have a thickness that can transmit light (preferably, approximately from 5 to 30 nm). For example, Al having a thickness of 20 nm can be used as the cathode 7013. The electroluminescent layer 7014 may be formed by a single layer or a lamination layer as in the case with FIGS. 11A and 11B. Though the anode 7015 is not required to transmit light, the anode can be formed by a transparent conductive film as in the case with FIGS. 11A and 11B. As the light-shielding film 7016, metals or the like that reflect light can be used; however, it is not limited to a metal film. For example, resin or the like added with black pigments can be used.

The light-emitting element 7012 is formed by the overlap of the cathode 7013, the electroluminescent layer 7014, and the anode 7015. In the pixel shown in FIG. 11B, light generated in the light-emitting element 7012 emits passing through the cathode 7013 as denoted by an outline arrow.

FIG. 11F is a cross-sectional view of a pixel used in the case that a drive TFT 7021 is n-type, and light generated in a light-emitting element 7022 emits passing through both an anode 7025 and a cathode 7023. In FIGS. 11E and 11F, the cathode 7023 of the light-emitting element 7022 is formed over a transparent conductive film 7027 connected electrically to the drive TFT 7021, and an electroluminescent layer 7024 and an anode 7025 are formed sequentially over the cathode 7023. As the cathode 7023, a known material can be used as long as it is a conductive film having a small work function as in the case with FIGS. 11A and 11B. The cathode 7023 is formed to have a thickness that can transmit light. For example, Al having a thickness of 20 nm can be used as the cathode 7023. The electroluminescent layer 7024 may be formed by a single layer or a lamination layer as in the case with FIGS. 11A and 11B. Though the anode 7025 can be formed by a transparent conductive film as in the case with FIG. 11B.

The light-emitting element 7022 corresponds to the overlap region of the cathode 7023, the electroluminescent layer 7024, and the anode 7025. In the pixel shown in FIG. 11F, light generated in the light-emitting element 7022 emits passing through both the anode 7025 and the cathode 7023 as denoted by an outline arrow.

The structure in which the drive TFT is electrically connected to a light-emitting element is explained in this example. A current control TFT may be formed between the drive TFT and the light-emitting element to be connected with them.

In all pixels shown in FIGS. 11A to 11F, a protective film can be formed to cover the light-emitting element. As the protective film, a film that is hard to penetrate substances such as moisture or oxygen that lead to deterioration of the light-emitting element compared to other insulating films is used. Typically, a DLC film, a carbon nitride film, a silicon nitride film formed by RF sputtering, or the like is preferably used. Alternatively, the protective film can be formed by stacking the foregoing film that is hard to penetrate substances such as moisture or oxygen and a film that is easier to penetrate substances such as moisture or oxygen compared to the foregoing film.

In FIGS. 11D and 11F, in order to emit light from a cathode, there is a method of using ITO that has less work function by adding with Li can be used besides a method of thickening a film thickness of the cathode.

A light-emitting device according to the invention shown in FIGS. 11A to 11F is illustrative and not restrictive, and can be modified based on the spirit of techniques according to the invention.

EXAMPLE 2

In this example, an example of variation of a pixel using a semiamorphous TFT included in a light-emitting device according to the invention is explained.

Figure 12A:
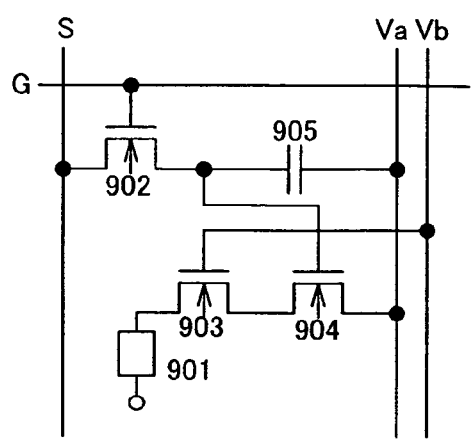
FIGS. 12A to 12E are circuit diagrams for showing a pixel included in a light-emitting device according to the invention.

FIG. 12A shows an embodiment of a pixel according to this example. A pixel shown in FIG. 12A comprising a light-emitting element 901, a switching TFT 902 used as a switching element for controlling the input of a video signal to the pixel, a drive TFT 903 for controlling a current value flowing through the light-emitting element 901, and a current control TFT 904 for determining to supply current or not to the light-emitting element 901. Moreover, a capacitor element 905 for holding electric potential of a video signal may be provided to the pixel as in Embodiment.

The switching TFT 902, the drive TFT 903, and the current control TFT 904, which may be either n-type or p-type, have the same polarity. The drive TFT 903 operates in a saturation region and the current control TFT 904 operates in a linear region.

The length of the drive TFT 903 is longer than width. The length of the current control TFT 904 is the same as or shorter than the width. Preferably, the ratio of length to width of the drive TFT 903 is at least 5. Accordingly, variation of luminance of the light-emitting element 901 between pixels due to the difference of characteristics of the drive TFT 903 can be reduced. Let the channel length of the drive TFT be L1, let the channel width of the drive TFT be W1, let the channel length of the current control TFT be L2, and let the channel width of the current control TFT be W2, if L1/W1:L2/W2=X: 1, X is preferably at least 5 and at most 6000. For example, if X=6000, it is preferable that L1/W1=500 µm/3 µm, L2/W2=3 µm/100 µm.

A gate electrode of the switching TFT 902 is connected to a scanning line G. Either a source or a drain of the switching TFT 902 is connected to a signal line S, and the other is connected to the gate electrode of the current control TFT 904. A gate electrode of the drive TFT 903 is connected to a second power source line Vb. The drive TFT 903 and the current control TFT 904 are connected to a first power source line Va and the light-emitting element 901 for supplying current supplied from the first power source line Va to the light-emitting element 901 as drain current of the drive TFT 903 and the current control TFT 904. In this example, a source of the current control TFT 904 is connected to the first power source line Va, and a drain of the drive TFT 903 is connected to a pixel electrode of the light-emitting element 901.

A source of the drive TFT 903 may be connected to the first power source line Va, and a drain of the current control TFT 904 may be connected to a pixel electrode of the light-emitting element 901.

The light-emitting element 901 comprising an anode, a cathode, and an electroluminescent layer interposed between the anode and the cathode. As shown in FIG. 12A, in the case that the cathode is connected to the drive TFT 903, the cathode serves as a pixel electrode, and the anode serves as an opposing electrode. Each the opposing electrode of the light-emitting element 901 and the first power source line Va has an electrical potential of difference, so that forward bias current is supplied to the light-emitting element 901. The opposing electrode of the light-emitting element 901 is connected to an auxiliary electrode W.

Either two electrodes of the capacitor element 905 is connected to the first power source line Va, and the other is connected to a gate electrode of the current control TFT 904. The capacitor element 905 is provided to hold an electric potential of difference between electrodes of the capacitor element 905 when the switching TFT 902 is in the non-select state (OFF state). FIG. 12A shows the structure in which the capacitor element 905 is provided, but the structure of a pixel shown in FIG. 12A is not restrictive. The capacitor element 905 is not necessarily provided.

In FIG. 12A, the drive TFT 903 and the current control TFT 904 are n-type, and a drain of the drive TFT 903 is connected to the cathode of the light-emitting element 901. On the contrary, in the case that the drive TFT 903 and the current control TFT 904 are p-type, a source of the drive TFT 903 is connected to the anode of the light-emitting element 901. In this instance, the anode of the light-emitting element 901 serves as a pixel electrode and the cathode of the light-emitting element 901 serves as an opposing electrode.

Figure 12B:
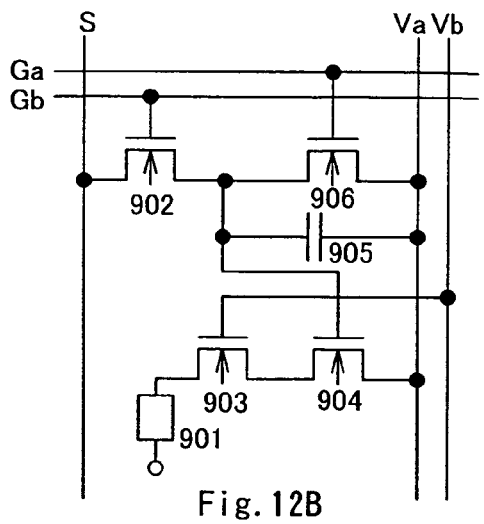

FIG. 12B is a circuit diagram of a pixel shown in FIG. 12A provided with a TFT (erasing TFT) 906 for turning compellingly OFF the current control TFT 904. In FIG. 12B, like components are denoted by like numerals as of FIG. 12A. In order to distinguish a first scanning line from a second scanning line, the first scanning line is denoted by Ga and the second scanning line is denoted by Gb. A gate electrode of the erasing TFT 906 is connected to the second scanning line Gb, and either a source or a drain of the erasing TFT 906 is connected to a gate electrode of the current control TFT 904, and the other is connected to the first power source line Va. The erasing TFT 906, which can be either n-type or p-type, has the same polarity as that of another TFT in the pixel.

Figure 12C:
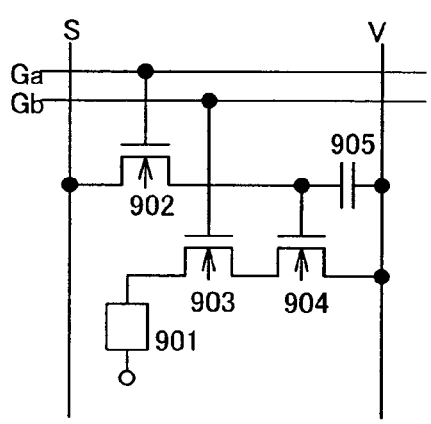

FIG. 12C is a circuit diagram of a pixel shown in FIG. 12A in which a gate electrode of the drive TFT 903 is connected the second scanning line Gb. In FIG. 12C, like components are denoted by like numerals as of FIG. 12A. As shown in FIG. 12C, light emission from the light-emitting element 901 can be terminated compellingly by switching electric potential to be fed to a gate electrode of the drive TFT 903.

Figure 12D:
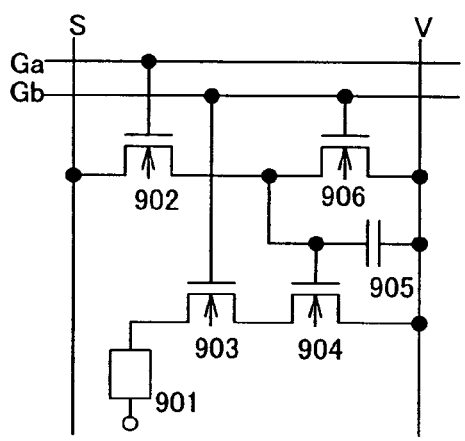

FIG. 12D is a circuit diagram of a pixel shown in FIG. 12C provided with a TFT (erasing TFT) 906 for turning compellingly OFF the current control TFT 904. In FIG. 12D, like components are denoted by like numerals as of FIGS. 12A to 12D, and FIG. 12C. A gate electrode of the erasing TFT 906 is connected to the second scanning line Gb, and either a source or a drain of the erasing TFT 906 is connected to a gate electrode of the current control TFT 904, and the other is connected to the first power source line V. The erasing TFT 906, which can be either n-type or p-type, has the same polarity as that of another TFT in the pixel.

Figure 12E:
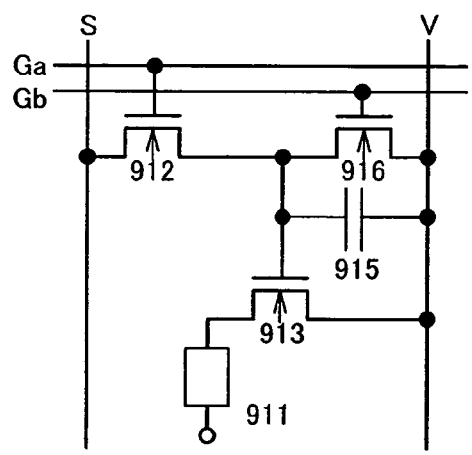

FIG. 12E shows the structure of a pixel without a current control TFT. In FIG. 12E, reference numeral 911 denotes a light-emitting element; 912, a switching TFT; 913, a drive TFT; 915, a capacitor element; and 916, an erasing TFT 916. A gate electrode of the switching TFT 912 is connected to the first scanning line Ga, and either a source or a drain of the switching TFT 912 is connected to the signal line S, the other is connected to a gate electrode of the drive TFT 913. A source of the drive TFT 913 is connected to the power source line V, and a drain of the drive TFT 913 is connected to a pixel electrode of the light-emitting element 911. An opposing electrode of the light-emitting element 911 is connected to the auxiliary electrode W. A gate electrode of the erasing TFT 916 is connected to the second scanning line Gb, and either a source or a drain of the erasing TFT 916 is connected to a gate electrode of the drive TFT 913, and the other is connected to the power source line V.

The structure of a pixel included in a light-emitting device according to the invention is not limited to the structure explained in this example.

EXAMPLE 3

In this example, one embodiment of a semiamorphous TFT included in a light-emitting device according to the invention is explained.

Figure 13A:
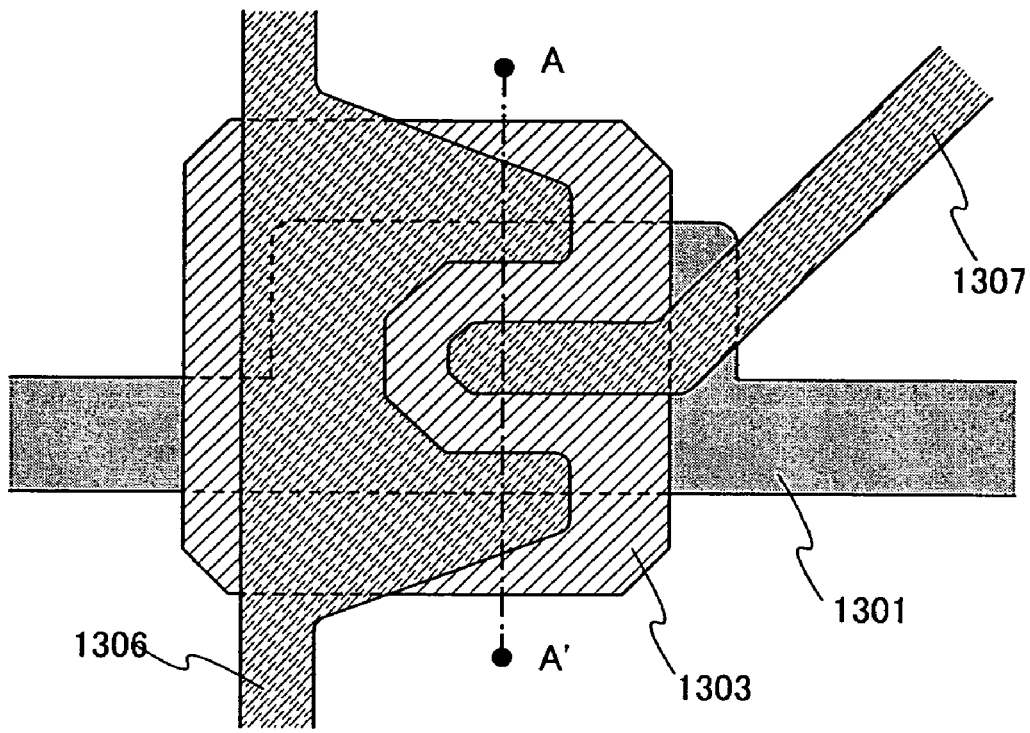
FIGS. 13A and 13B show an embodiment of a semiamorphous TFT used for a light-emitting device according to the invention.
Figure 13B:
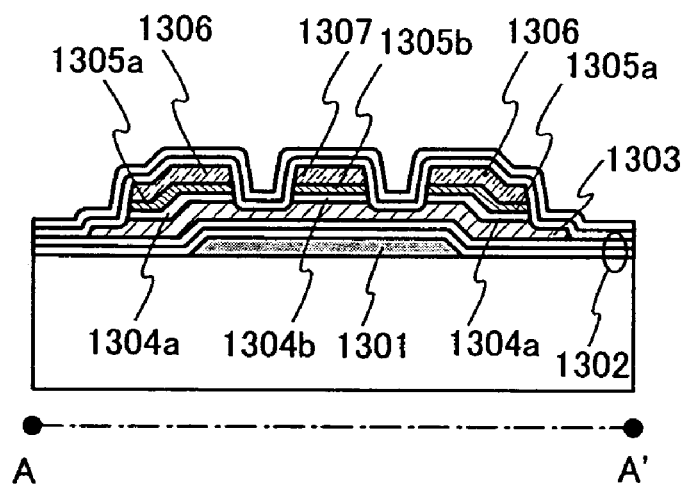

FIG. 13A is a top view of a semiamorphous TFT. FIG. 13B is a cross-sectional view of FIG. 13A taken along line A-A'. Reference numeral 1301 denotes a gate wiring a part of which serves as a gate electrode. The gate wiring 1301 overlaps with a first semiconductor film 1303 formed by semiamorphous semiconductor via a gate insulating film 1302. Second semiconductor films 1304a, 1304b are formed on the first semiconductor film 1303. Third semiconductor films 1305a, 1305b imparting one conductivity type are formed on the second semiconductor films 1304a, 1304b. Each reference numeral 1306, 1307 denotes wiring formed on the third semiconductor films 1305a, 1305b.

In a semiamorphous TFT shown in FIGS. 13A and 13B, a channel length can be kept constantly by spacing out the interval between the third semiconductor film 1305a and the third semiconductor film 1305b. Further, by arranging the third semiconductor film 1305a so as to enclose the edge of the third semiconductor film 1305b, the concentration of electric field can be relieved at a drain region side of a channel formation region. Moreover, since the ratio of a channel width to a channel length can be increased, ON current can be increased.

EXAMPLE 4

Figure 14A:
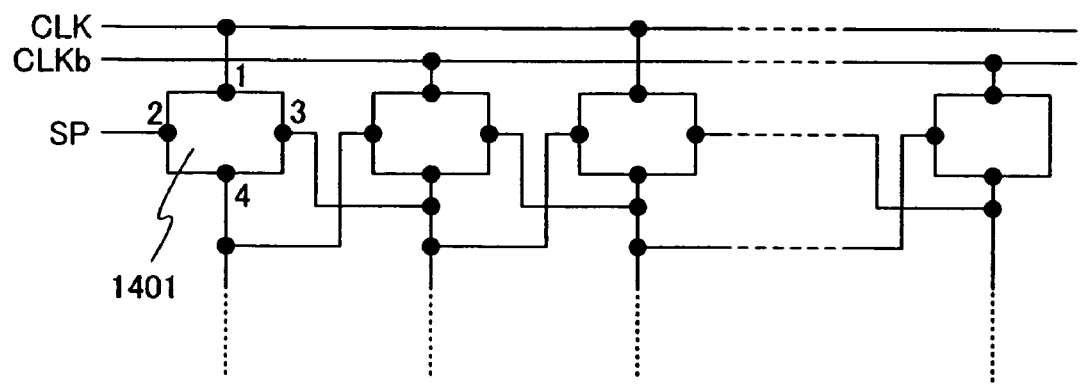
FIGS. 14A and 14B show an embodiment of a shift register used for a light-emitting device according to the invention.

In this example, one embodiment of a shift register used semiamorphous TFTs having the same polarity is explained. FIG. 14A shows the structure of a shift register according to this example. The shift register shown in FIG. 14A operates by using a first clock signal CLK, a second clock signal CLKb, and a start pulse signal SP. Reference numeral 1401 denotes a pulse output circuit. A specific structure of the pulse output circuit is illustrated in FIG. 14B.

The pulse output circuit 1401 comprises TFTs 801 to 806 and a capacitor element 807. A gate of the TFT 801 is connected to a node 2, a source of the TFT 801 is connected to a gate of the TFT 805, and the drain of the TFT 801 is given electric potential Vdd. A gate of the TFT 802 is connected to a gate of the TFT 806, a drain of the TFT 802 is connected to the gate of the TFT 805, and a source of the TFT 802 is given electrical potential Vss. A gate of the TFT 803 is connected to a node 3, a source of the TFT 803 is connected to the gate of the TFT 806, and a drain of the TFT 803 is given electrical potential Vdd. A gate of the TFT 804 is connected to the node 2, a drain of the TFT 804 is connected to the gate of the TFT 805, and a source of the TFT 804 is given electrical potential Vss. The gate of the TFT 805 is connected to either electrode of the capacitor element 807, a drain of the TFT 805 is connected to a node 1, and a source of the TFT 805 is connected to another electrode of the capacitor element 807 and a node 4. Further, the TFT 806 is connected to either electrode of the capacitor element 807, a drain of the TFT 806 is connected to the node 4, and a source of the TFT 806 is given electric potential Vss.

Figure 14B:
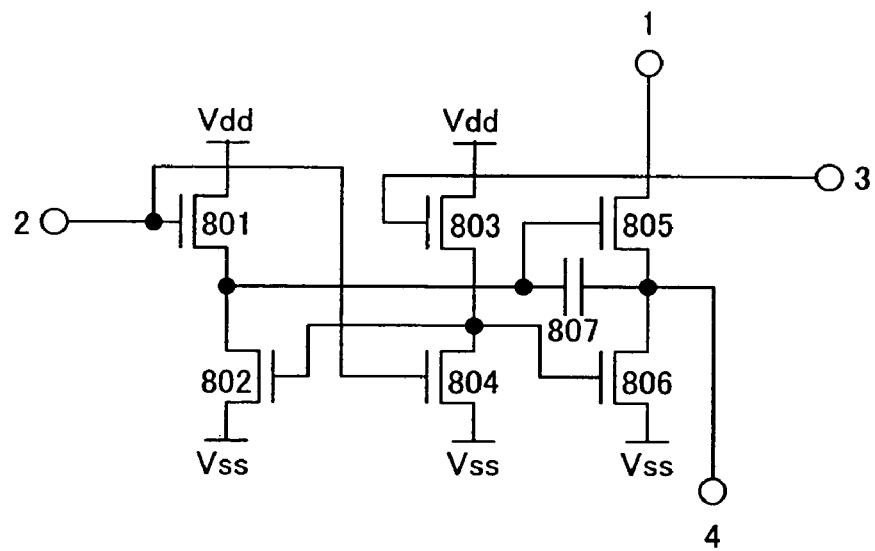

The operation of the pulse output circuit 1401 shown in FIG. 14B is explained. In case of H level, CLK, CLKb, and SP are Vdd, and in case of L level, the CLK, the CLKb, and the SP are Vss. For the simplification of explanation, assume that Vss=0.

When the SP becomes H level, the TFT 801 turns ON. Accordingly, electric potential of a gate of the TFT 805 is increased. Eventually, the TFT 801 turns OFF to be in suspension when electric potential of the gate of the TFT 805 becomes Vdd-Vth (Vth is a threshold value of the TFTs 801 to 806). On the contrary, when the SP becomes H level, the TFT 804 turns ON. Accordingly, electric potential of the gate of TFTs 802, 806 is reduced to be Vss eventually, and the TFTs 802, 806 turn OFF. The gate of the TFT 803 is L level at this time, and turns OFF.

Then, the SP becomes L level, and the TFTs 801, 804 turn OFF, then, electric potential of the gate of the TFT 805 is held at Vdd-Vth. When voltage between a gate and a source of the TFT 805 is larger than the threshold value Vth, the TFT 805 turns ON.

When the CLK given to the node 1 changes from L level to H level, the node 4, that is, electric potential of the source of the TFT 805 becomes increased since the TFT 805 turns ON. Further, since capacity coupling is presented between the gate and the source of the TFT 805, electric potential of the gate of the TFT 805 in suspension is increased again in accordance with the increase of electric potential of the node 4. Eventually, the electric potential of the gate of the TFT 805 becomes higher than Vdd+Vth, and the electric potential of the node 4 becomes equal to Vdd. The foregoing operation is performed in the pulse output circuit 1401 of the second stage or later, and pulse is output sequentially.

EXAMPLE 5

In this example, an external view of a panel that is one embodiment of a light-emitting device according to the invention is explained with reference to FIGS. 15A and 15B. FIG. 15A is a top view of the panel in which a semiamorphous TFT and a light-emitting element formed over a first substrate are sealed between the first substrate and a second substrate with sealant. FIG. 15B is a cross-sectional view of FIG. 15A taken along line A-A'.

Sealant 4005 is provided so as to enclose a pixel portion 4002 and a scanning line drive circuit 4004, each of which is formed over a first substrate 4001. A second substrate 4006 is provided over the pixel portion 4002 and the scanning line drive circuit 4004. Therefore, the pixel portion 4002 and the scanning line drive circuit 4004 are sealed with filler 4007 by the first substrate 4001, and the sealant 4005, and the second substrate 4006. A signal line drive circuit 4003 formed by a polysilicon semiconductor film over separately prepared substrate is mounted on the region separated from the region enclosed by the sealant 4005 over the first substrate 4001 in the panel. In this example, the example in which the signal line drive circuit with a TFT formed by a poly crystalline semiconductor film is pasted onto the first substrate 4001 is explained; however, the signal line drive circuit with a transistor formed by a single crystalline semiconductor film can be pasted thereto. FIG. 15B shows a TFT 4009 formed by a poly crystalline semiconductor film included in the signal line drive circuit 4003.

The pixel portion 4002 and the scanning line drive circuit 4004, each of which is formed over the first substrate 4001, have a plurality of TFTs. FIG. 15B exemplifies a TFT 4010 included in the pixel portion 4002. In this example, the TFT 4010 is assumed a drive TFT, but the TFT 4010 may be an erasing TFT or a current control TFT. The TFT 4010 is a TFT using semiamorphous semiconductor.

Reference numeral 4011 denotes a light-emitting element. A pixel electrode of the light-emitting element 4011 is electrically connected to a drain of the TFT 4010 via a wiring 4017. In this example, an opposing electrode of the light-emitting element 4011 is connected to a transparent conductive film 4012. The structure of the light-emitting element 4011 is not limited to that explained in Embodiment. The structure of the light-emitting element 4011 can be appropriately modified in accordance with the direction of coupling light, the polarity of the TFT 4010, or the like.

Various signals and electric potential (not shown in FIG. 15B) fed to the separately formed signal line drive circuit 4003, the scanning line drive circuit 4004 or the pixel portion 4002 are supplied from a connecting terminal 4016 via lead wirings 4014 and 4015.

In this example, the connecting terminal 4016 is formed by a conductive film that is used for forming a pixel electrode included in the light-emitting element 4011. The lead wiring 4014 is formed by a conductive film that is used for forming a wiring 4017. The lead wiring 4015 is formed by a conductive film that is used for forming a gate electrode included in the TFT 4010.

The connecting terminal 4016 is electrically connected to a terminal included in an FPC 4018 via an anisotropic conductive film 4019.

As the first substrate 4001 and the second substrate 4006, glass, metals (typically, stainless), ceramic, or plastic can be used. As the plastic, an FRP (Fiberglass-Reinforced Plastics) plate, a PVF (polyvinyl fluoride) film, a mylar film, a polyester film, or an acryl resin film can be used. Alternatively, a sheet formed by sandwiching aluminum foil by a PVF film or a mylar film can be used.

The substrate that transmits light generated in the light-emitting element 4011 should be transparent. In this case, a light-transmitting material such as a glass plate, a plastic plate, a polyester film, or an acryl film is used.

As the filler 4007, ultraviolet curing resin or thermal curing resin can be used besides an inert gas such as nitrogen or argon. PVC (polyvinyl chloride), acryl, polyimide, epoxy resin, silicon resin, PVB (polyvinyl butyral), or EVA (ethylene vinyl acetate) can be used. In this example, nitrogen is used as the filler.

FIGS. 15A and 15B show an example of the structure in which the signal line drive circuit 4003 is separately formed to be mounted on the first substrate 4001. However, this example is not limited thereto. The scanning line drive circuit can be separately formed to be mounted, or only a part of the signal line drive circuit or only a part of the scanning line drive circuit can be separately formed to be mounted.

This example can be practiced by being combined with structures explained in another example.

EXAMPLE 6

A light-emitting device using a light-emitting element is a self luminous type. Accordingly, the light-emitting device has high visibility in bright light and wide viewing angle. Therefore, the light-emitting device can be used for display portions of various electric appliances.

As electronic appliances using a light-emitting device according to the present invention, a video camera, a digital camera, a goggle type display (a head mounted display), a navigation system, a sound reproduction device (car audio, audio set, or the like), a laptop computer, a game machine, a personal digital assistant (mobile computer, a cellular phone, a portable game machine, an electronic book, or the like), an image reproduction system provided with a recording medium (specifically, a DVD, or the like), or the like can be nominated. Especially, a wide viewing angle is important for a portable electronic appliance since a screen is often viewed from an oblique direction. Therefore, a light-emitting device is preferably used for the portable electronic appliance. According to the invention, the process for crystallization is not required after depositing a semiconductor film. Accordingly, a large panel is comparatively easy to be manufactured. Hence, the invention can be effectively used for an electronic appliance using a large panel of from 10 to 50 inches. Specific examples of such electronic appliances are illustrated in FIGS. 16A to 16C.

Figure 16A:
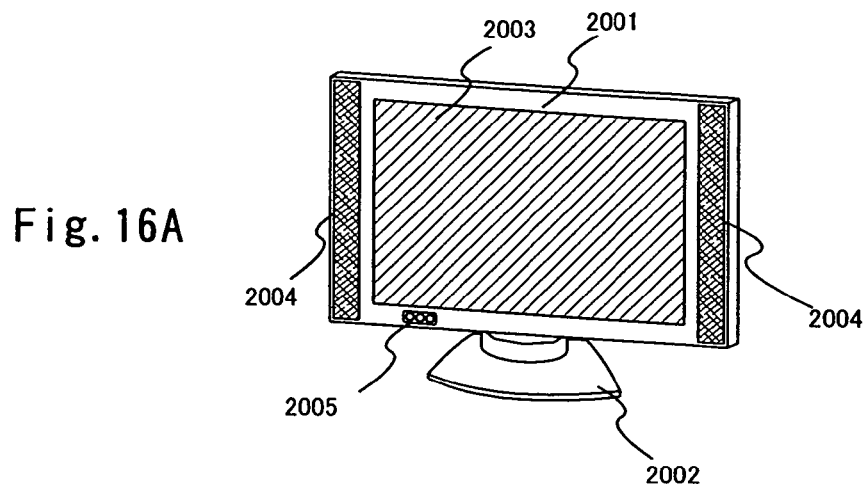
FIGS. 16A to 16C show electric appliances using a light-emitting device according to the invention.

FIG. 16A shows a display device composed of a housing 2001; a support 2002; a display portion 2003; a speaker unit 2004; a video input terminal 2005; and the like. The display device can be completed by using a light-emitting device according to the present invention for the display portion 2003. The light-emitting device is a self luminous type, and so back light is not required. Accordingly, the display portion can be formed to be thinner than that of a liquid crystal display device. The display device includes a display information device such as for a personal computer; TV broadcast reception; advertisement; and the like.

Figure 16B:
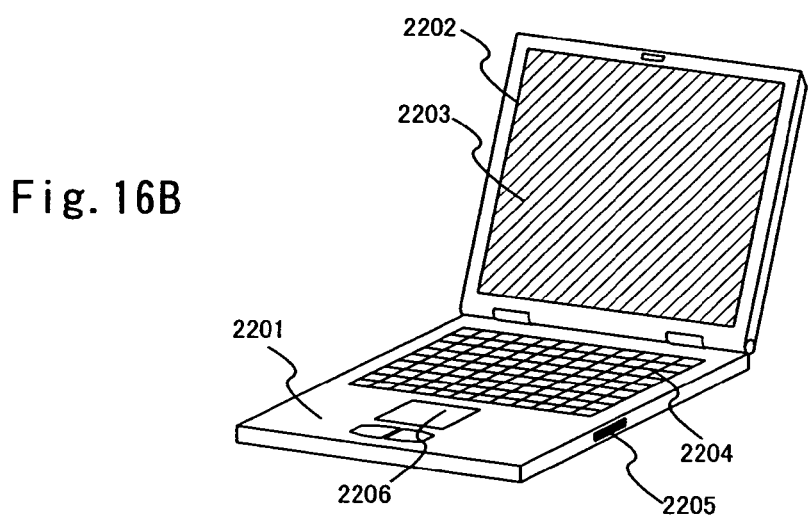

FIG. 16B shows a laptop computer composed of a main body 2201; a housing 2202; a display portion 2203; a keyboard 2204; an external connection port 2205; a pointing mouse 2206; and the like. The laptop computer is completed by using the light-emitting device according to the invention as the display portion 2203.

Figure 16C:
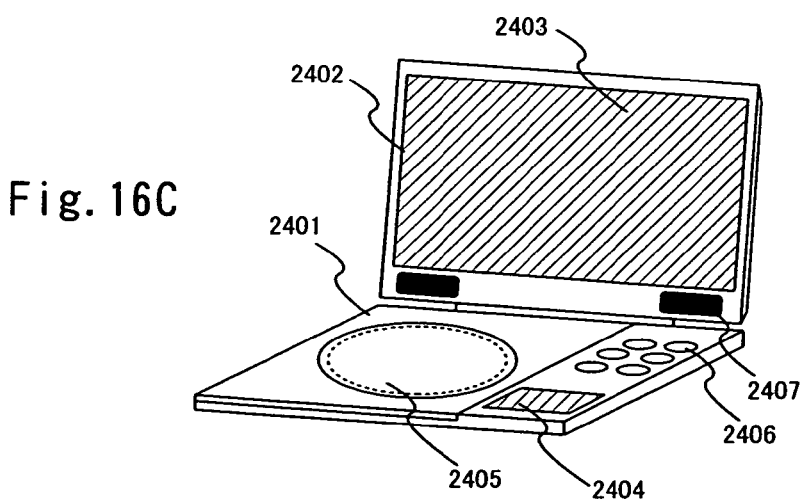

FIG. 16C shows a portable image reproduction device including a recording medium (specifically, a DVD reproduction device) composed of a main body 2401; a housing 2402; a display portion A 2403; another display portion B 2404; a recording medium (DVD or the like) reading portion 2405; operation keys 2406; a speaker portion 2407; and the like. The display portion A 2403 is used mainly for displaying image information, while the display portion B 2404 is used mainly for displaying character information. The portable image reproduction device including a recording medium includes a game machine, and the like. The image reproduction device according to the invention is completed by using the light-emitting device according to the invention as the display potion A 2403 and the display portion B 2404.

A portion of the light-emitting device that is emitting light consumes power, and so it is desirable to display information in such a manner that the light-emitting portion is as small as possible. Accordingly, when the light-emitting device is used to a display portion which mainly displays character information, for example, a display portion of a portable information terminal, more particular, a cellular phone or a sound reproduction device, it is desirable to drive the light-emitting device so that the character information is formed by a light-emitting portion against a background that is a non-emission portion.

As set forth above, the applicable range of the invention is extremely large, and can be applied to various fields' electronic appliances. Electronic appliances explained in this example can be practiced by being combined with any structure described in Examples 1 to 4.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A light-emitting device comprising:
a pixel portion; and
a drive circuit for controlling operation of the pixel portion,
wherein the pixel portion is provided with a pixel including a light-emitting element and a first TFT for controlling supply of current to the light-emitting element,
wherein each of a second TFT included in the drive circuit and the first TFT comprises:
a gate electrode over a substrate;
a gate insulating film formed over the gate electrode;
a first semiconductor film comprising semi-amorphous silicon over the gate electrode with the gate insulating film interposed therebetween;
a pair of third semiconductor films comprising semi-amorphous silicon over the first semiconductor film; and
a pair of second semiconductor films over the pair of third semiconductor films, respectively,
wherein the pair of third semiconductor films are non-doped semiconductor films,
wherein the pair of third semiconductor films and the pair of second semiconductor films have n-type conductive type, and
wherein the pair of third semiconductor films has lower conductivity than the pair of second semiconductor films.

2. A light-emitting device according to claim 1, wherein the second TFT and the first TFT are covered by a nitride film or a silicon nitride oxide film.

3. A light-emitting device according to claim 1, wherein the pixel further includes a third TFT for controlling input of a video signal to the pixel, and the third TFT is formed to have a multi-gate structure.

4. A light-emitting device according to claim 1, wherein the drive circuit includes an analog switch.

5. An electronic appliance having the light-emitting device according to claim 1, wherein the electronic appliance is selected from the group consisting of a video camera, a digital camera, a goggle type display, a navigation system, a sound reproduction device, a laptop computer, a game machine, a personal digital assistant and an image reproduction system.

6. The light-emitting device according to claim 1, wherein the first semiconductor film comprises an impurity imparting p-type conductive type.

7. A light-emitting device comprising:
a pixel portion; and
a drive circuit for controlling operation of the pixel portion,
wherein the pixel portion is provided with a pixel including a light-emitting element and a first TFT for controlling supply of current to the light-emitting element,
wherein each of a second TFT included in the drive circuit and the first TFT comprises:
a gate electrode over a substrate;
a gate insulating film formed over the gate electrode;
a first semiconductor film comprising semi-amorphous silicon over the gate electrode with the gate insulating film interposed therebetween;
a channel protective film over the gate electrode with the gate insulating film and the first semiconductor film interposed therebetween;
a pair of third semiconductor films comprising semi-amorphous silicon over the first semiconductor film and the channel protective film; and
a pair of second semiconductor films over the pair of third semiconductor films, respectively,
wherein the channel protective film is interposed between the pair of third semiconductor films,
wherein the pair of third semiconductor films are non-doped semiconductor films,
wherein the pair of third semiconductor films and the pair of second semiconductor films have n-type conductive type, and
wherein the pair of third semiconductor films has lower conductivity than the pair of second semiconductor films.

8. A light-emitting device according to claim 7, wherein the second TFT and the first TFT are covered by a nitride film or a silicon nitride oxide film.

9. A light-emitting device according to claim 7, wherein the pixel further includes a third TFT for controlling input of a video signal to the pixel, and the third TFT is formed to have a multi-gate structure.

10. A light-emitting device according to claim 7, wherein the drive circuit includes an analog switch.

11. An electronic appliance having the light-emitting device according to claim 7, wherein the electronic appliance is selected from the group consisting of a video camera, a digital camera, a goggle type display, a navigation system, a sound reproduction device, a laptop computer, a game machine, a personal digital assistant and an image reproduction system.

12. The light-emitting device according to claim 7, wherein the first semiconductor film comprises an impurity imparting p-type conductive type.

13. A light-emitting device comprising:
a pixel portion including a plurality of pixels; and
a drive circuit for controlling operation of the pixel portion,
wherein each of the plurality of pixels includes a light-emitting element and a first TFT for controlling supply of current to the light-emitting element,
wherein the drive circuit includes a second TFT,
wherein each of the first TFT and the second TFT comprises:
a gate electrode over a substrate;
a gate insulating film formed over the gate electrode;
a first semiconductor film comprising semi-amorphous silicon over the gate electrode with the gate insulating film interposed therebetween;
a pair of third semiconductor films comprising semi-amorphous silicon over the first semiconductor film; and
a pair of second semiconductor films over the pair of third semiconductor films, respectively, wherein the pair of third semiconductor films are non-doped semiconductor films, wherein the pair of third semiconductor films and the pair of second semiconductor films have n-type conductive type, and wherein the pair of third semiconductor films has lower conductivity than the pair of second semiconductor films.

14. A light-emitting device according to claim 13, wherein the first TFT and the second TFT are covered by a nitride film or a silicon nitride oxide film.

15. A light-emitting device according to claim 13, wherein each of the plurality of pixels further includes a third TFT for controlling input of a video signal, and the third TFT is formed to have a multi-gate structure.

16. A light-emitting device according to claim 13, wherein the drive circuit includes an analog switch.

17. An electronic appliance having the light-emitting device according to claim 13, wherein the electronic appliance is selected from the group consisting of a video camera, a digital camera, a goggle type display, a navigation system, a sound reproduction device, a laptop computer, a game machine, a personal digital assistant and an image reproduction system.

18. The light-emitting device according to claim 13, wherein the first semiconductor film comprises an impurity imparting p-type conductive type.

* * * * *